(12) United States Patent
Wang et al.

(10) Patent No.: US 10,490,737 B2
(45) Date of Patent: *Nov. 26, 2019

(54) MAGNETIC MEMORY ELEMENT INCLUDING MAGNESIUM PERPENDICULAR ENHANCEMENT LAYER

(71) Applicant: Avalanche Technology, Inc., Fremont, CA (US)

(72) Inventors: Zihui Wang, Mountain View, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,974

(22) Filed: Feb. 27, 2019

(65) Prior Publication Data

US 2019/0198752 A1 Jun. 27, 2019

Related U.S. Application Data

(63) Continuation of application No. 16/112,323, filed on Aug. 24, 2018, which is a continuation of application
(Continued)

(51) Int. Cl.
*H01L 43/08* (2006.01)
*G11C 11/15* (2006.01)
(Continued)

(52) U.S. Cl.
CPC .............. *H01L 43/08* (2013.01); *G11C 11/15* (2013.01); *G11C 11/16* (2013.01); *G11C 11/161* (2013.01);
(Continued)

(58) Field of Classification Search
CPC .......... H01L 43/08; H01L 43/02; H01L 43/10; G11C 11/15
See application file for complete search history.

(56) References Cited

U.S. PATENT DOCUMENTS 6,596,419 B1 7/2003 Chen et al.
8,218,270 B1 7/2012 Zeltser et al.
(Continued)

*Primary Examiner* — Marc Anthony Armand
(74) *Attorney, Agent, or Firm* — Bing K. Yen

(57) ABSTRACT

The present invention is directed to a magnetic memory element including a magnetic free layer structure that includes two magnetic free layers separated by a magnesium perpendicular enhancement layer; an insulating tunnel junction layer formed adjacent to the magnetic free layer structure; a first magnetic reference layer formed adjacent to the insulating tunnel junction layer; a second magnetic reference layer separated from the first magnetic reference layer by a non-magnetic perpendicular enhancement layer; an anti-ferromagnetic coupling layer formed adjacent to the second magnetic reference layer; and a magnetic fixed layer structure formed adjacent to the anti-ferromagnetic coupling layer. The two magnetic free layers have a same variable magnetization direction substantially perpendicular to layer planes thereof. The first and second magnetic reference layers have a first invariable magnetization direction substantially perpendicular to layer planes thereof. The magnetic fixed layer structure has a second invariable magnetization direction substantially opposite to the first invariable magnetization direction.

26 Claims, 19 Drawing Sheets

Related U.S. Application Data

No. 15/794,983, filed on Oct. 26, 2017, now Pat. No. 10,079,338, which is a continuation of application No. 14/797,458, filed on Jul. 13, 2015, now Pat. No. 9,831,421, which is a continuation-in-part of application No. 14/560,740, filed on Dec. 4, 2014, now Pat. No. 9,082,951, which is a continuation-in-part of application No. 14/256,192, filed on Apr. 18, 2014, now Pat. No. 9,647,202, which is a continuation-in-part of application No. 14/053,231, filed on Oct. 14, 2013, now Pat. No. 9,070,855, which is a continuation-in-part of application No. 14/026,163, filed on Sep. 13, 2013, now Pat. No. 9,024,398, which is a continuation-in-part of application No. 13/029,054, filed on Feb. 16, 2011, now Pat. No. 8,598,576, and a continuation-in-part of application No. 13/277,187, filed on Oct. 19, 2011, now abandoned, which is a continuation-in-part of application No. 12/965,733, filed on Dec. 10, 2010, now Pat. No. 8,623,452, said application No. 14/797,458 is a continuation-in-part of application No. 14/657,608, filed on Mar. 13, 2015, now Pat. No. 9,318,179, which is a continuation of application No. 13/225,338, filed on Sep. 2, 2011, now Pat. No. 9,019,758.

(60) Provisional application No. 61/483,314, filed on May 6, 2011, provisional application No. 61/382,815, filed on Sep. 14, 2010.

(51) Int. Cl.
| | | |
|---|---|---|
| *G11C 11/16* | (2006.01) | |
| *H01L 43/02* | (2006.01) | |
| *H01L 43/10* | (2006.01) | |
| *H01F 10/32* | (2006.01) | |
| *H01F 41/30* | (2006.01) | |
| *H01L 27/22* | (2006.01) | |
| *H01L 29/66* | (2006.01) | |
| *B82Y 40/00* | (2011.01) | |

(52) U.S. Cl.
CPC ....... *H01F 10/329* (2013.01); *H01F 10/3286* (2013.01); *H01F 41/302* (2013.01); *H01L 27/228* (2013.01); *H01L 29/66984* (2013.01); *H01L 43/02* (2013.01); *H01L 43/10* (2013.01); *B82Y 40/00* (2013.01)

(56) References Cited

U.S. PATENT DOCUMENTS

| | | | |
|---|---|---|---|
| 9,082,951 B2* | 7/2015 | Gan | H01F 10/3286 |
| 2003/0200927 A1 | 10/2003 | Watanabe et al. | |
| 2005/0185455 A1 | 8/2005 | Huai | |
| 2006/0098354 A1 | 5/2006 | Parkin | |
| 2009/0161267 A1* | 6/2009 | Kawai | B82Y 10/00 360/324.2 |
| 2009/0174968 A1 | 7/2009 | Singleton et al. | |
| 2010/0096716 A1 | 4/2010 | Ranjan et al. | |
| 2010/0230770 A1 | 9/2010 | Yoshikawa et al. | |
| 2011/0031569 A1 | 2/2011 | Watts et al. | |
| 2011/0080782 A1* | 4/2011 | Li | G11C 8/08 365/171 |
| 2011/0096443 A1 | 4/2011 | Zhang et al. | |
| 2011/0102948 A1 | 5/2011 | Apalkov et al. | |
| 2011/0171493 A1 | 7/2011 | Worledge et al. | |
| 2011/0188157 A1 | 8/2011 | Zhao et al. | |
| 2011/0227179 A1 | 9/2011 | Kitagawa et al. | |
| 2011/0293967 A1 | 12/2011 | Zhang et al. | |
| 2012/0012953 A1 | 1/2012 | Lottis et al. | |
| 2012/0267733 A1 | 10/2012 | Hu et al. | |

\* cited by examiner

MAGNETIC MEMORY ELEMENT INCLUDING MAGNESIUM PERPENDICULAR ENHANCEMENT LAYER

CROSS-REFERENCE TO RELATED APPLICATIONS

The present application is a continuation of the commonly assigned application bearing Ser. No. 16/112,323 filed on Aug. 24, 2018 and entitled "Magnetic Random Access Memory with Perpendicular Enhancement Layer," which is a continuation of the commonly assigned application bearing Ser. No. 15/794,983 filed on Oct. 26, 2017 and entitled "Magnetic Random Access Memory with Perpendicular Enhancement Layer," which is a continuation of the commonly assigned application bearing Ser. No. 14/797,458 filed on Jul. 13, 2015 by Wang et al. and entitled "Magnetic Random Access Memory with Perpendicular Enhancement Layer," which is a continuation-in-part of the commonly assigned application bearing Ser. No. 14/560,740 filed on Dec. 4, 2014 by Gan et al. and entitled "Magnetic Random Access Memory with Perpendicular Enhancement Layer," which is a continuation-in-part of the commonly assigned application bearing Ser. No. 14/256,192 filed on Apr. 18, 2014 by Gan et al. and entitled "Magnetic Random Access Memory with Perpendicular Enhancement Layer," which is a continuation-in-part of the commonly assigned application bearing Ser. No. 14/053,231 filed on Oct. 14, 2013 by Gan et al. and entitled "Magnetic Random Access Memory Having Perpendicular Enhancement Layer," which is a continuation-in-part of the commonly assigned application bearing Ser. No. 14/026,163 filed on Sep. 13, 2013 by Gan et al. and entitled "Perpendicular STTMRAM Device with Balanced Reference Layer," which is a continuation-in-part of the commonly assigned application bearing Ser. No. 13/029,054 filed on Feb. 16, 2011 by Zhou et al. and entitled "Magnetic Random Access Memory With Field Compensating Layer and Multi-Level Cell," and a continuation-in-part of the commonly assigned application bearing Ser. No. 13/277,187 filed on Oct. 19, 2011 by Huai et al. and entitled "Memory System Having Thermally Stable Perpendicular Magneto Tunnel Junction (MTJ) and A Method of Manufacturing Same," which claims priority to U.S. Provisional Application No. 61/483,314 and is a continuation-in-part of the commonly assigned application bearing Ser. No. 12/965,733 filed on Dec. 10, 2010 by Zhou et al. and entitled "Magnetic Random Access Memory (MRAM) with Enhanced Magnetic Stiffness and Method of Making Same." The application bearing Ser. No. 15/794,983 is also a continuation-in-part of the commonly assigned application bearing Ser. No. 14/657,608 filed on Mar. 13, 2015, which is a continuation of the commonly assigned application bearing Ser. No. 13/225,338 filed on Sep. 2, 2011, which claims priority to a previously-filed U.S. provisional application, U.S. Application No. 61/382,815, filed on Sep. 14, 2010. All of these applications are incorporated herein by reference, including their specifications. The present application is related to the commonly assigned copending application bearing Ser. No. 13/737,897 filed on Jan. 9, 2013, the commonly assigned copending application bearing Ser. No. 14/021,917 filed on Sep. 9, 2013, the commonly assigned copending application bearing Ser. No. 13/099,321 filed on May 2, 2011, the commonly assigned copending application bearing Ser. No. 13/928,263 filed on Jun. 26, 2013, the commonly assigned copending application bearing Ser. No. 14/173,145 filed on Feb. 5, 2014, the commonly assigned copending application bearing Ser. No. 14/195,427 filed on Mar. 3, 2014, the commonly assigned copending application bearing Ser. No. 14/198,405 filed on Mar. 5, 2014, and the commonly assigned copending application bearing Ser. No. 14/255,884 filed on Apr. 17, 2014.

BACKGROUND

The present invention relates to a magnetic random access memory (MRAM) device, and more particularly, to a spin transfer torque MRAM device including at least a perpendicular enhancement layer in its memory element.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of an appropriate voltage or current to the magnetic memory element, the electrical resistance of the magnetic memory element would change accordingly, thereby switching the stored logic in the respective memory cell.

FIG. 1 is a schematic circuit diagram of a conventional STT-MRAM device 30, which comprises a plurality of memory cells 32, each of the memory cells 32 including a selection transistor 34 coupled to a magnetic memory element 36; a plurality of parallel word lines 38 with each being coupled to the gates of a respective row of the selection transistors 34 in a first direction; and a plurality of parallel bit lines 40 with each being coupled to a respective row of the memory elements 36 in a second direction perpendicular to the first direction; and optionally a plurality of parallel source lines 42 with each being coupled to a respective row of the selection transistors 34 in the first or second direction.

FIG. 2 shows a conventional magnetic memory element comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have magnetization directions 58 and 60, respectively, which are substantially perpendicular to the respective layer planes. Therefore, the MTJ 56 is a perpendicular type comprising the magnetic layers 50 and 52 with perpendicular anisotropy. Upon application of an appropriate current through the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. However, when the magnetization directions 60 and 58 of the magnetic free layer 52 and reference layer 50 are substantially parallel, electrons polarized by the magnetic reference layer 50 may tunnel through the insulating tunnel junction layer 54, thereby decreasing the electrical resistivity of the perpendicular MTJ 56. Conversely, the electrical resistivity of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

One of many advantages of STT-MRAM over other types of non-volatile memories is scalability. As the size of the perpendicular MTJ 56 is reduced, the current required to switch the magnetization direction 60 of the magnetic free layer 52 is reduced accordingly, thereby reducing power consumption. However, the thermal stability of the magnetic layers 50 and 52, which is required for long term data retention, also degrades with miniaturization of the perpendicular MTJ 56.

For the foregoing reasons, there is a need for an STT-MRAM device that has a thermally stable perpendicular MTJ memory element and that can be inexpensively manufactured.

SUMMARY

The present invention is directed to a spin transfer torque (STT) magnetic random access memory (MRAM) element that satisfies this need. An STT-MRAM element having features of the present invention includes a magnetic tunnel junction (MTJ) structure formed between an optional seed layer and an optional cap layer. The MTJ structure comprises a magnetic free layer structure and a magnetic reference layer structure with an insulating tunnel junction layer interposed therebetween, and a magnetic fixed layer separated from the magnetic reference layer structure by an anti-ferromagnetic coupling layer.

The magnetic free layer structure may comprise one or more magnetic free layers having a same variable magnetization direction perpendicular to the layer planes thereof. In an embodiment, the magnetic free layer structure includes a perpendicular enhancement layer formed between two magnetic free layers. The magnetic reference layer structure may comprise one or more magnetic reference layers having a first fixed magnetization direction perpendicular to the layer planes thereof. In another embodiment, the magnetic reference layer structure includes a perpendicular enhancement layer formed between two magnetic reference layers. The magnetic fixed layer may comprise one or more magnetic sublayers having a second fixed magnetization direction that is substantially perpendicular to the layer planes thereof and is substantially opposite to the first fixed magnetization direction. In still another embodiment, the magnetic fixed layer includes a perpendicular enhancement layer formed between two magnetic fixed sublayers.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB may be an alloy, a compound, or a combination thereof, unless otherwise specified or the context excludes that possibility.

Where reference is made herein to a multilayer structure [C/D] formed by interleaving layer(s) of material C with layer(s) of material D, at least one of material C and material D may be made of elemental metal, elemental non-metal, alloy, or compound. The multilayer structure [C/D] may contain any number of layers but may have as few as two layers consisting of one layer of material C and one layer of material D. The multilayer structure [C/D] has a stack structure that may begin with one material and end with the other material such as C/D/C/D or may begin with one material and end with the same material such as C/D/C. Individual layers of material C may or may not have the same thickness. Likewise, individual layers of material D may or may not have the same thickness. The multilayer structure [C/D] may or may not exhibit the characteristic satellite peaks associated with superlattice when analyzed by X-ray or neutron diffraction.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

Figure 3A:
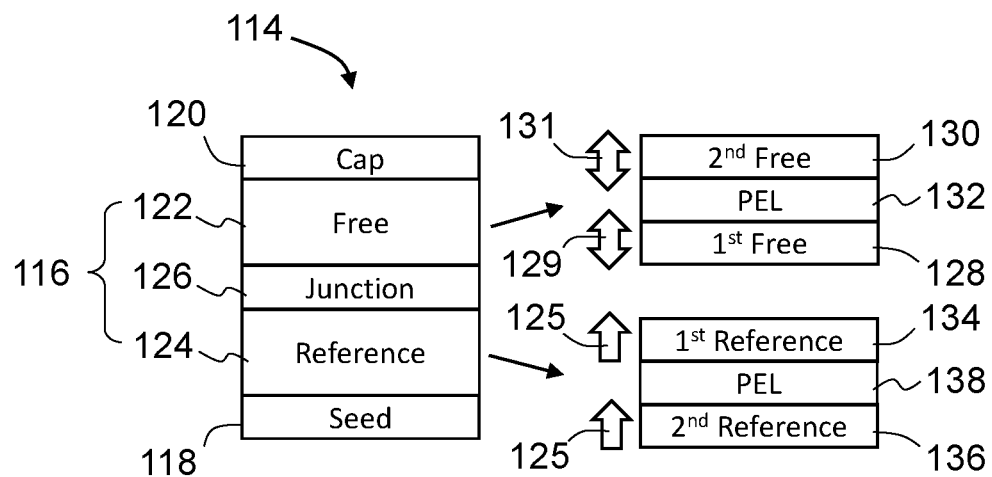
FIGS. 3A and 3B are cross-sectional views of a first embodiment of the present invention as applied to a perpendicular MTJ memory element.

A first embodiment of the present invention as applied to a perpendicular MTJ memory element that includes at least a perpendicular enhancement layer (PEL) to improve the perpendicular anisotropy of magnetic layers adjacent thereto will now be described with reference to FIG. 3A. Referring now to FIG. 3A, the illustrated memory element 114 includes a magnetic tunnel junction (MTJ) structure 116 in between an optional seed layer 118 and an optional cap layer 120. The MTJ structure 116 comprises a magnetic free layer structure 122 and a magnetic reference layer structure 124 with an insulating tunnel junction layer 126 interposed therebetween. The magnetic reference layer structure 124 and the magnetic free layer structure 122 may be formed adjacent to the optional seed layer 118 and cap layer 120, respectively.

The magnetic free layer structure 122 includes a first magnetic free layer 128 formed adjacent to the insulating tunnel junction layer 126 and a second magnetic free layer 130 separated from the first magnetic free layer 128 by a first perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer structure 124 includes a first magnetic reference layer 134 formed adjacent to the insulating tunnel junction layer 126 and a second magnetic reference layer 136 separated from the first magnetic reference layer 134 by a second perpendicular enhancement layer 138. The first and second magnetic reference layers 134 and 136 have a first fixed magnetization direction 125 substantially perpendicular to the layer planes thereof. The first magnetic reference layer 134 may comprise one or more magnetic sublayers having the first fixed magnetization direction 125. Similarly, the second magnetic reference layer 136 may comprise one or more magnetic sublayers having the first fixed magnetization direction 125.

Figure 3B:
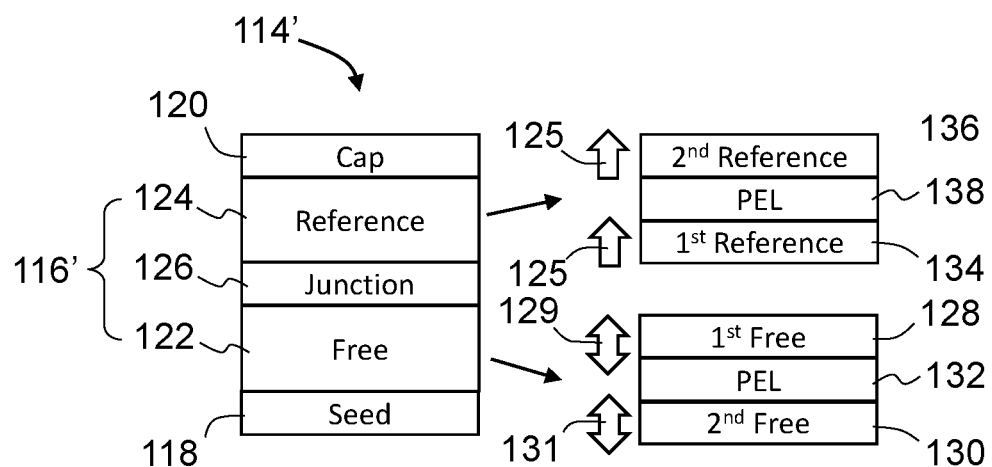

The stacking order of the individual layers in the MTJ structure 116 of the memory element 114 may be inverted as illustrated in FIG. 3B without affecting the device performance. The memory element 114' of FIG. 3B has an MTJ structure 116' that has the same layers but with the inverted stacking order comparing to the MTJ structure 116. Accordingly, the magnetic free layer structure 122 and the magnetic reference layer structure 124 may be formed adjacent to the optional seed layer 118 and cap layer 120, respectively.

Figure 4A:
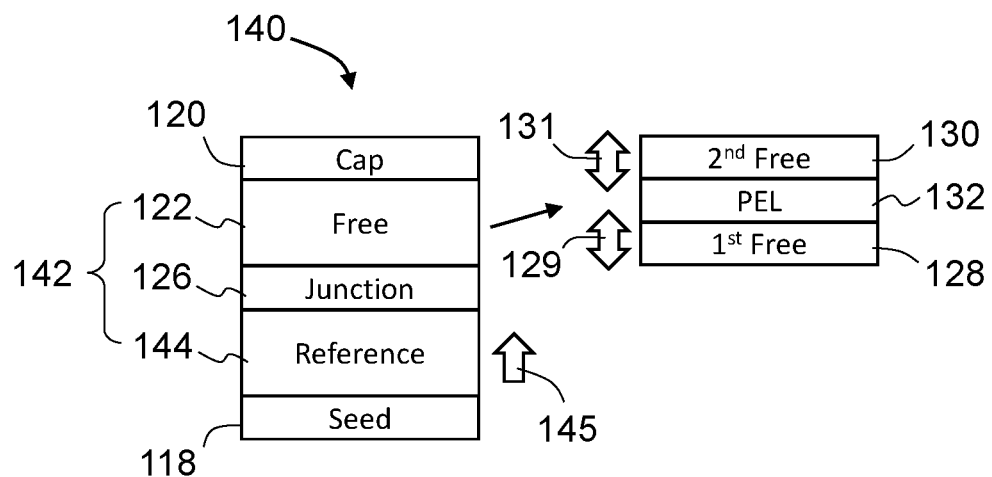
FIGS. 4A and 4B are cross-sectional views of a second embodiment of the present invention as applied to a perpendicular MTJ memory element.

A second embodiment of the present invention as applied to an MTJ memory element is illustrated in FIG. 4A. The memory element 140 includes a magnetic tunnel junction (MTJ) structure 142 in between an optional seed layer 118 and an optional cap layer 120. The MTJ structure 142 comprises a magnetic free layer structure 122 and a magnetic reference layer 144 with an insulating tunnel junction layer 126 interposed therebetween. The magnetic reference layer 144 and the magnetic free layer structure 122 may be formed adjacent to the optional seed layer 118 and cap layer 120, respectively.

The magnetic free layer structure 122 includes a first magnetic free layer 128 formed adjacent to the insulating tunnel junction layer 126 and a second magnetic free layer 130 separated from the first magnetic free layer 128 by a perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer 144 has a first fixed magnetization direction 145 substantially perpendicular to the layer plane thereof. The magnetic reference layer 144 may comprise one or more magnetic sublayers having the first fixed magnetization direction 145.

Figure 4B:
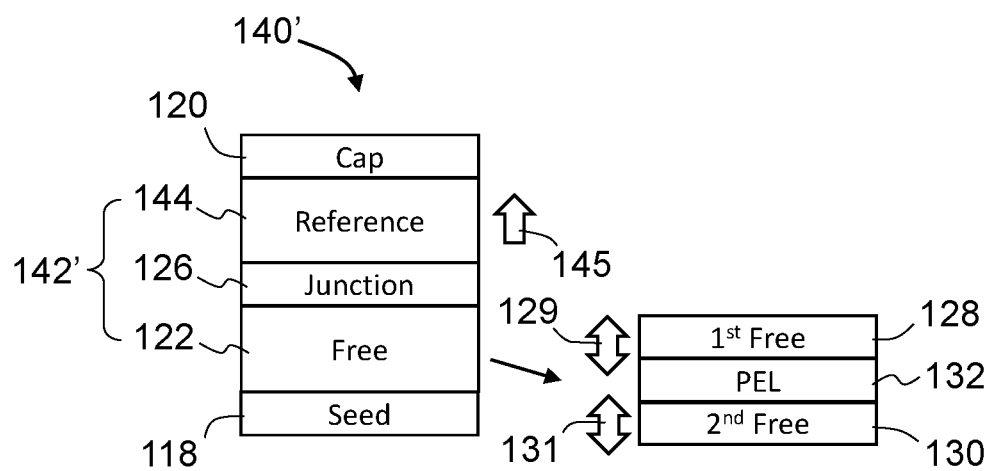

The stacking order of the individual layers in the MTJ structure 142 of the memory element 140 may be inverted as illustrated in FIG. 4B without affecting the device performance. The memory element 140' of FIG. 4B has an MTJ structure 142' that has the same layers but with the inverted stacking order comparing to the MTJ structure 142. Accordingly, the magnetic free layer structure 122 and the magnetic reference layer 144 may be formed adjacent to the optional seed layer 118 and cap layer 120, respectively.

Figure 5A:
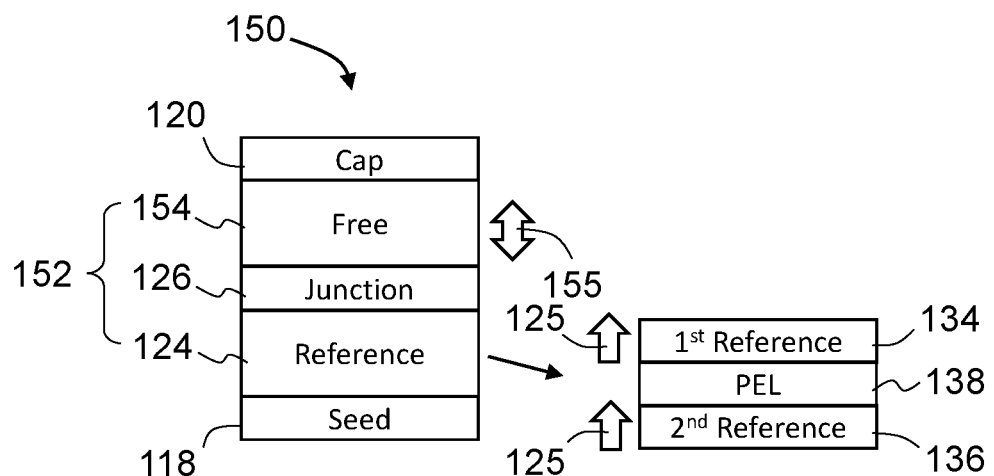
FIGS. 5A and 5B are cross-sectional views of a third embodiment of the present invention as applied to a perpendicular MTJ memory element.

A third embodiment of the present invention as applied to an MTJ memory element is illustrated in FIG. 5A. The memory element 150 includes a magnetic tunnel junction (MTJ) structure 152 in between an optional seed layer 118 and an optional cap layer 120. The MTJ structure 152 comprises a magnetic free layer 154 and a magnetic reference layer structure 124 with an insulating tunnel junction layer 126 interposed therebetween. The magnetic reference layer structure 124 and the magnetic free layer 154 may be formed adjacent to the optional seed layer 118 and cap layer 120, respectively.

The magnetic free layer 154 has a variable magnetization direction 155 substantially perpendicular to the layer plane thereof. The magnetic free layer 154 may comprise one or more magnetic sublayers having the variable magnetization direction 155.

The magnetic reference layer structure 124 includes a first magnetic reference layer 134 formed adjacent to the insulating tunnel junction layer 126 and a second magnetic reference layer 136 separated from the first magnetic reference layer 134 by a perpendicular enhancement layer 138. The first and second magnetic reference layers 134 and 136 have a first fixed magnetization direction 125 substantially perpendicular to the layer planes thereof. The first magnetic reference layer 134 may comprise one or more magnetic sublayers having the first fixed magnetization direction 125. Similarly, the second magnetic reference layer 136 may comprise one or more magnetic sublayers having the first fixed magnetization direction 125.

Figure 5B:
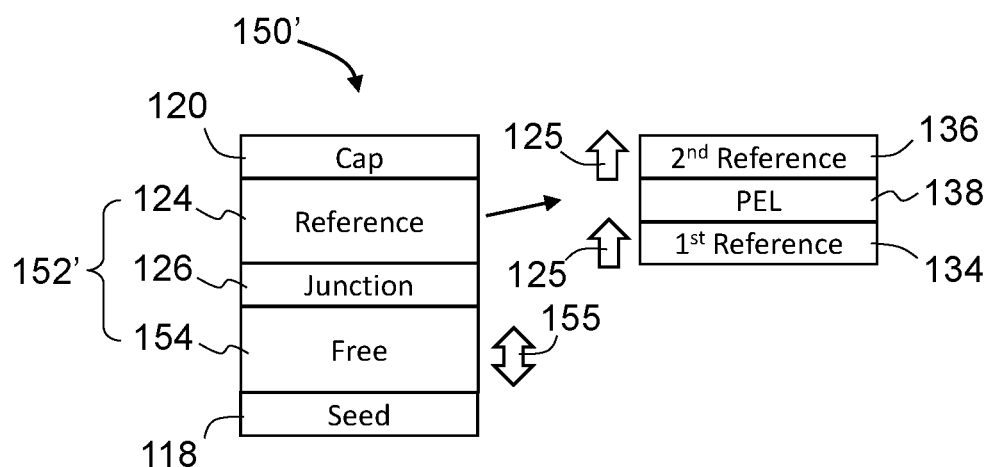

The stacking order of the individual layers in the MTJ structure 152 of the memory element 150 may be inverted as illustrated in FIG. 5B without affecting the device performance. The memory element 150' of FIG. 5B has an MTJ structure 152' that has the same layers but with the inverted stacking order comparing to the MTJ structure 152. Accordingly, the magnetic free layer 154 and the magnetic reference layer structure 124 may be formed adjacent to the optional seed layer 118 and cap layer 120, respectively.

The optional seed layer 118 of the memory elements 114, 114', 140, 140', 150, and 150' of FIGS. 3A, 3B, 4A, 4B, 5A, and 5B, respectively, may facilitate the optimal growth of magnetic layers formed thereon to increase perpendicular anisotropy. The seed layer 118 may also serve as a bottom electrode to the MTJ structures 116, 116', 142, 142', 152, and 152'. The seed layer 118 may comprise one or more seed sublayers, which may be formed adjacent to each other.

The optional cap layer 120 of the memory elements 114, 114', 140, 140', 150, and 150' of FIGS. 3A, 3B, 4A, 4B, 5A, and 5B, respectively, may function as a top electrode for the MTJ structures 116, 116', 142, 142', 152, and 152' and may also improve the perpendicular anisotropy of the magnetic layer formed adjacent thereto during annealing. The cap layer 120 may comprise one or more cap sublayers, which may be formed adjacent to each other.

For the MTJ structures 116, 116', 142, 142', 152, and 152' of FIGS. 3A, 3B, 4A, 4B, 5A, and 5B, the magnetic free layer structure 122 and the magnetic reference layer structure 124 include therein the perpendicular enhancement layers 132 and 138, respectively. The perpendicular enhancement layers 132 and 138 may further improve the perpendicular anisotropy of the magnetic layers formed adjacent thereto during deposition or annealing or both. Each of the perpendicular enhancement layers 132 and 138 may have a single layer structure or may comprise multiple perpendicular enhancement sublayers, which may be formed adjacent to each other.

Figure 6A:
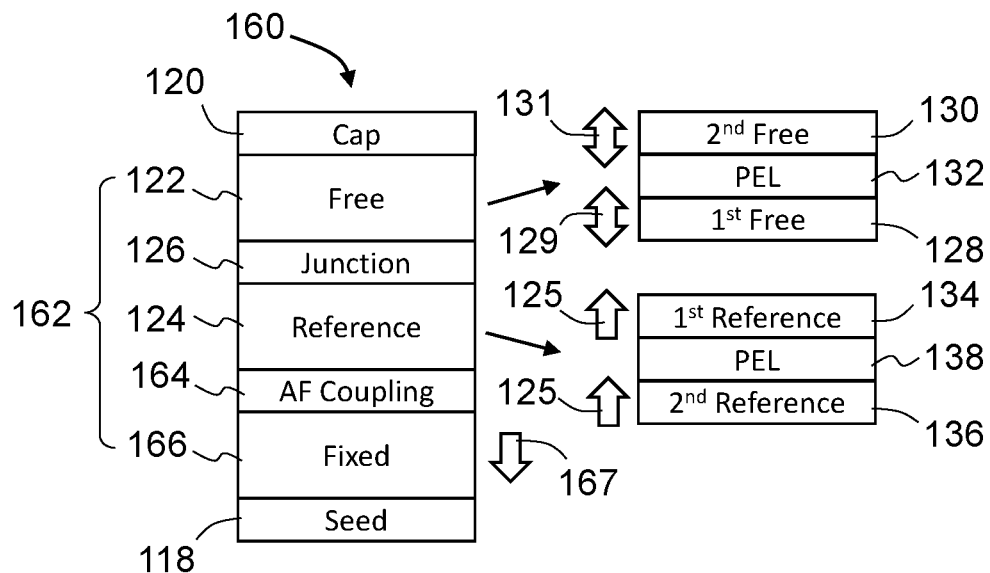
FIGS. 6A and 6B are cross-sectional views of a fourth embodiment of the present invention as applied to a perpendicular MTJ memory element.

A fourth embodiment of the present invention as applied to an MTJ memory element is illustrated in FIG. 6A. The memory element 160 includes a magnetic tunnel junction (MTJ) structure 162 in between an optional seed layer 118 and an optional cap layer 120. The MTJ structure 162 comprises a magnetic free layer structure 122 and a magnetic reference layer structure 124 with an insulating tunnel junction layer 126 interposed therebetween, an anti-ferromagnetic coupling layer 164 formed adjacent to the magnetic reference layer structure 124, and a magnetic fixed layer 166 formed adjacent to the anti-ferromagnetic coupling layer 164. The magnetic fixed layer 166 and the magnetic free layer structure 122 may be formed adjacent to the optional seed layer 118 and cap layer 120, respectively. The memory element 160 of FIG. 6A is different from the memory element 114 of FIG. 3A in that the anti-ferromagnetic coupling layer 164 and the magnetic fixed layer 166 have been inserted in between the optional seed layer 118 and the magnetic reference layer structure 124.

The magnetic free layer structure 122 includes a first magnetic free layer 128 formed adjacent to the insulating tunnel junction layer 126 and a second magnetic free layer 130 separated from the first magnetic free layer 128 by a first perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer structure 124 includes a first magnetic reference layer 134 formed adjacent to the insulating tunnel junction layer 126 and a second magnetic reference layer 136 separated from the first magnetic reference layer 134 by a second perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic fixed layer 166 has a second fixed magnetization direction 167 that is substantially perpendicular to the layer plane thereof and is substantially opposite to the first fixed magnetization direction 125. The magnetic fixed layer 166 may comprise one or more magnetic sublayers having the second fixed magnetization direction 167.

Figure 6B:
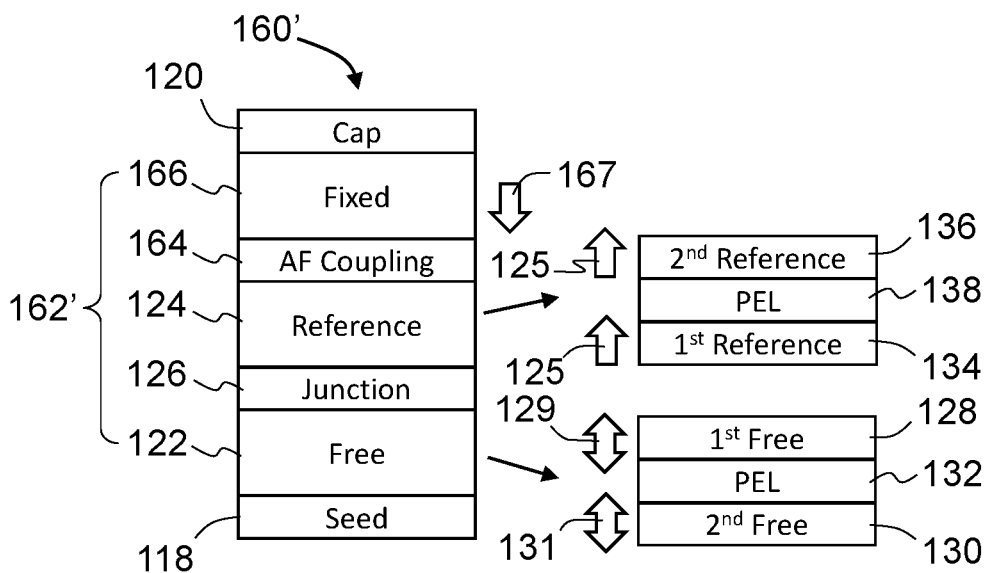

The stacking order of the individual layers in the MTJ structure 162 of the memory element 160 may be inverted as illustrated in FIG. 6B without affecting the device performance. The memory element 160' of FIG. 6B has an MTJ structure 162' that has the same layers but with the inverted stacking order comparing to the MTJ structure 162. Accordingly, the magnetic free layer structure 122 and the magnetic fixed layer 166 may be formed adjacent to the optional seed layer 118 and cap layer 120, respectively.

Figure 7A:
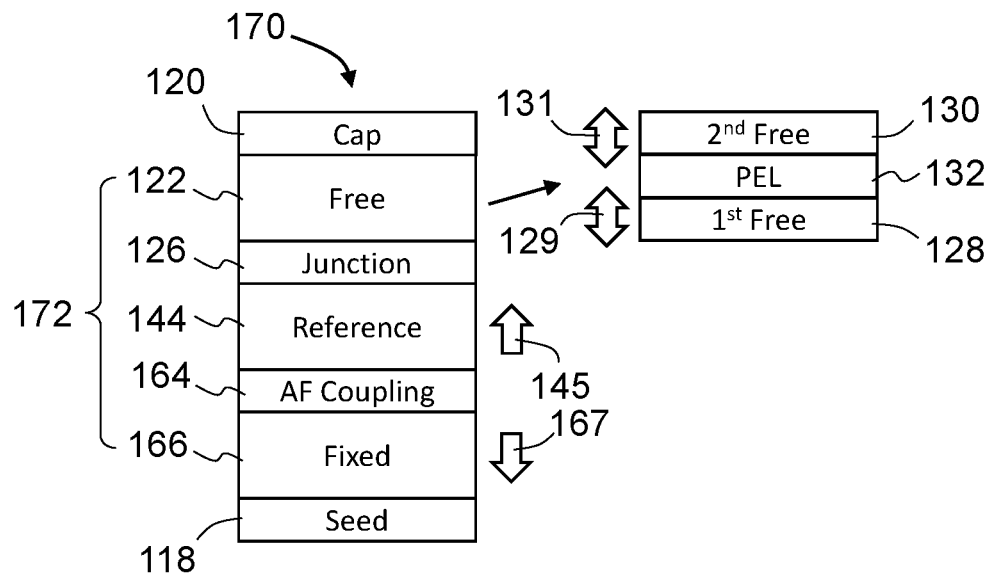
FIGS. 7A and 7B are cross-sectional views of a fifth embodiment of the present invention as applied to a perpendicular MTJ memory element.

A fifth embodiment of the present invention as applied to an MTJ memory element is illustrated in FIG. 7A. The memory element 170 includes a magnetic tunnel junction (MTJ) structure 172 in between an optional seed layer 118 and an optional cap layer 120. The MTJ structure 172 comprises a magnetic free layer structure 122 and a magnetic reference layer 144 with an insulating tunnel junction layer 126 interposed therebetween, an anti-ferromagnetic coupling layer 164 formed adjacent to the magnetic reference layer 144, and a magnetic fixed layer 166 formed adjacent to the anti-ferromagnetic coupling layer 164. The magnetic fixed layer 166 and the magnetic free layer structure 122 may be formed adjacent to the optional seed layer 118 and cap layer 120, respectively. The memory element 170 of FIG. 7A is different from the memory element 140 of FIG. 4A in that the anti-ferromagnetic coupling layer 164 and the magnetic fixed layer 166 have been inserted in between the optional seed layer 118 and the magnetic reference layer 144.

The magnetic free layer structure 122 includes a first magnetic free layer 128 formed adjacent to the insulating tunnel junction layer 126 and a second magnetic free layer 130 separated from the first magnetic free layer 128 by a perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer 144 has a first fixed magnetization direction 145 substantially perpendicular to the layer plane thereof. The magnetic reference layer 144 may comprise one or more magnetic sublayers having the first fixed magnetization direction 145.

The magnetic fixed layer 166 has a second fixed magnetization direction 167 that is substantially perpendicular to the layer plane thereof and is substantially opposite to the first fixed magnetization direction 145. The magnetic fixed layer 166 may comprise one or more magnetic sublayers having the second fixed magnetization direction 167.

Figure 7B:
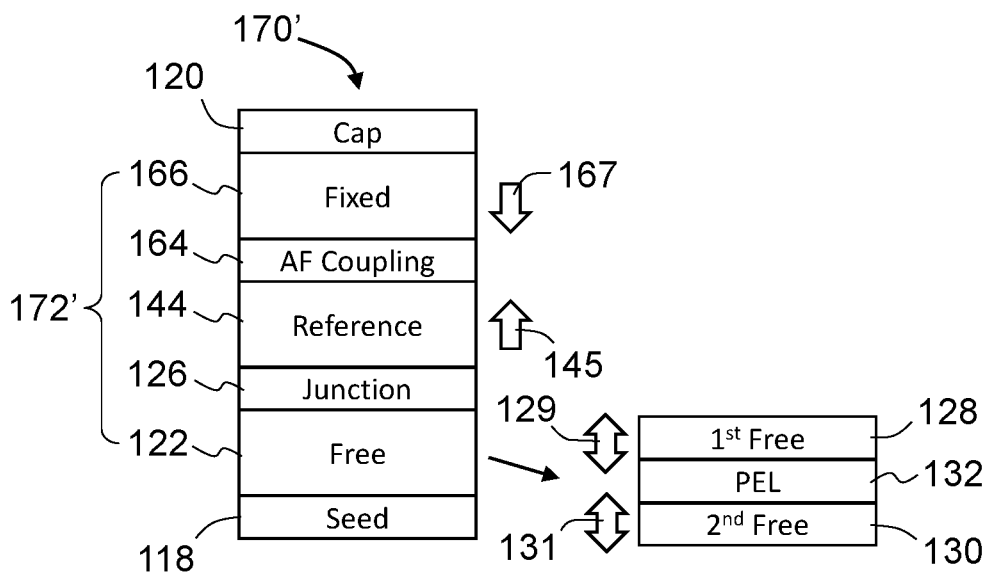

The stacking order of the individual layers in the MTJ structure 172 of the memory element 170 may be inverted as illustrated in FIG. 7B without affecting the device performance. The memory element 170' of FIG. 7B has an MTJ structure 172' that has the same layers but with the inverted stacking order comparing to the MTJ structure 172. Accordingly, the magnetic free layer structure 122 and the magnetic fixed layer 166 may be formed adjacent to the optional seed layer 118 and cap layer 120, respectively.

Figure 8A:
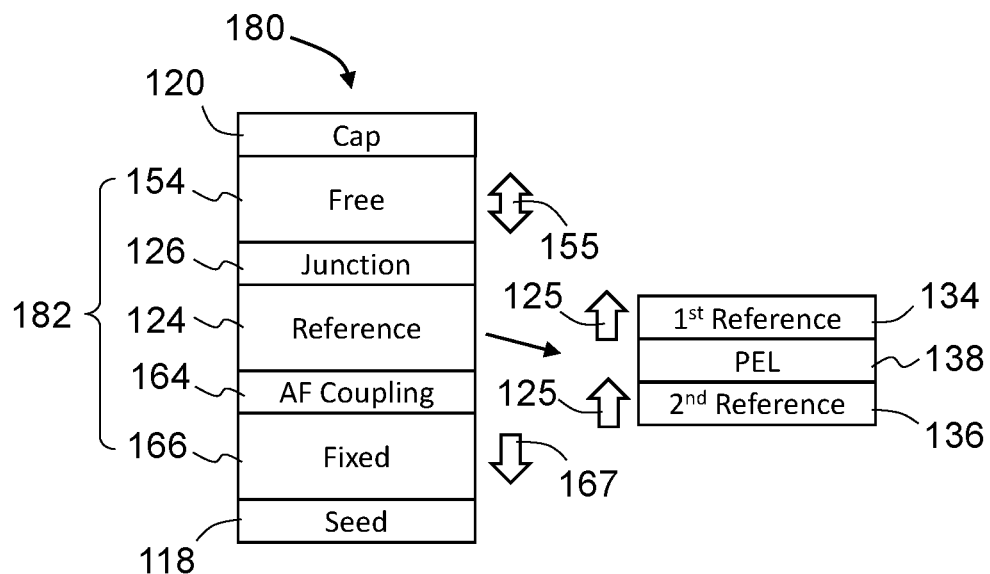
FIGS. 8A and 8B are cross-sectional views of a sixth embodiment of the present invention as applied to a perpendicular MTJ memory element.

A sixth embodiment of the present invention as applied to an MTJ memory element is illustrated in FIG. 8A. The memory element 180 includes a magnetic tunnel junction (MTJ) structure 182 in between an optional seed layer 118 and an optional cap layer 120. The MTJ structure 182 comprises a magnetic free layer 154 and a magnetic reference layer structure 124 with an insulating tunnel junction layer 126 interposed therebetween, an anti-ferromagnetic coupling layer 164 formed adjacent to the magnetic reference layer structure 124, and a magnetic fixed layer 166 formed adjacent to the anti-ferromagnetic coupling layer 164. The magnetic fixed layer 166 and the magnetic free layer 154 may be formed adjacent to the optional seed layer 118 and cap layer 120, respectively. The memory element 180 of FIG. 8A is different from the memory element 150 of FIG. 5A in that the anti-ferromagnetic coupling layer 164 and the magnetic fixed layer 166 have been inserted in between the optional seed layer 118 and the magnetic reference layer structure 124.

The magnetic free layer 154 has a variable magnetization direction 155 substantially perpendicular to the layer plane thereof. The magnetic free layer 154 may comprise one or more magnetic sublayers having the variable magnetization direction 155.

The magnetic reference layer structure 124 includes a first magnetic reference layer 134 formed adjacent to the insulating tunnel junction layer 126 and a second magnetic reference layer 136 separated from the first magnetic reference layer 134 by a perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic fixed layer 166 has a second fixed magnetization direction 167 that is substantially perpendicular to the layer plane thereof and is substantially opposite to the first fixed magnetization direction 125. The magnetic fixed layer 166 may comprise one or more magnetic sublayers having the second fixed magnetization direction 167.

Figure 8B:
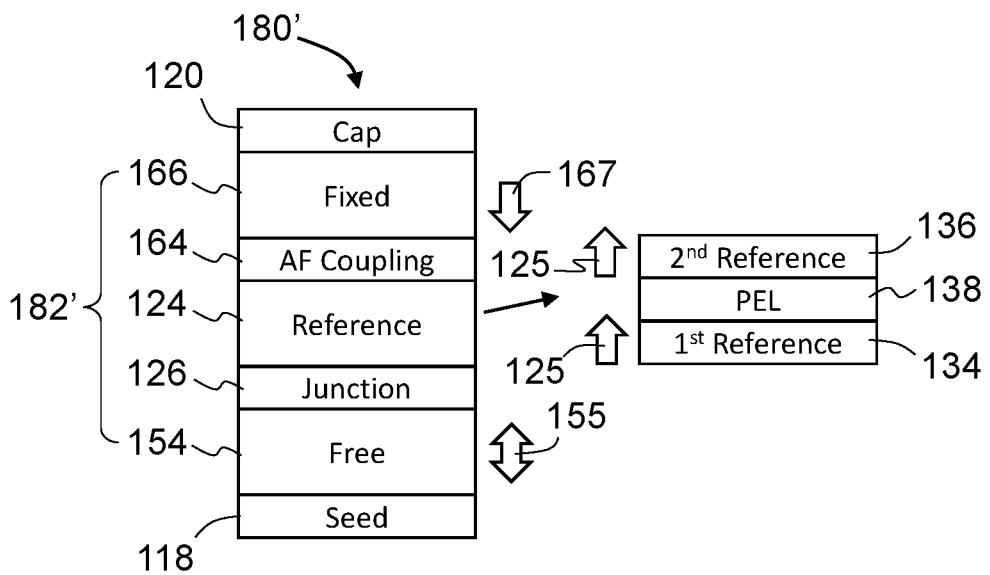

The stacking order of the individual layers in the MTJ structure 182 of the memory element 180 may be inverted as illustrated in FIG. 8B without affecting the device performance. The memory element 180' of FIG. 8B has an MTJ structure 182' that has the same layers but with the inverted stacking order comparing to the MTJ structure 182. Accordingly, the magnetic free layer 154 and the magnetic fixed layer 166 may be formed adjacent to the optional seed layer 118 and cap layer 120, respectively.

Comparing with the MTJ structures 116, 116', 142, 142', 152, and 152' of FIGS. 3A, 3B, 4A, 4B, 5A, and 5B, respectively, the MTJ structures 162, 162', 172, 172', 182, and 182' of FIGS. 6A, 6B, 7A, 7B, 8A, and 8B, respectively, have the magnetic fixed layer 166 anti-ferromagnetically coupled to the magnetic reference layer structure 124 or the magnetic reference layer 144 through the anti-ferromagnetic coupling layer 164. The magnetic fixed layer 166 is not an "active" layer like the magnetic reference layer structure and the magnetic free layer structure, which along with the tunnel junction layer 126 collectively form an MTJ that changes resistivity when a spin-polarized current pass therethrough. The magnetic fixed layer 166, which has an opposite magnetization direction compared with the magnetic reference layer structure 124 and the magnetic reference layer 144, may pin or stabilize the magnetization of the magnetic reference layer structure 124 and the magnetic reference layer 144 and may cancel, as much as possible, the external magnetic field exerted by the magnetic reference layer structure 124 or the magnetic reference layer 144 on the magnetic free layer structure 122 or the magnetic free layer 154, thereby minimizing the offset field or net external field in the magnetic free layer structure 122 or the magnetic free layer 154.

Figure 9A:
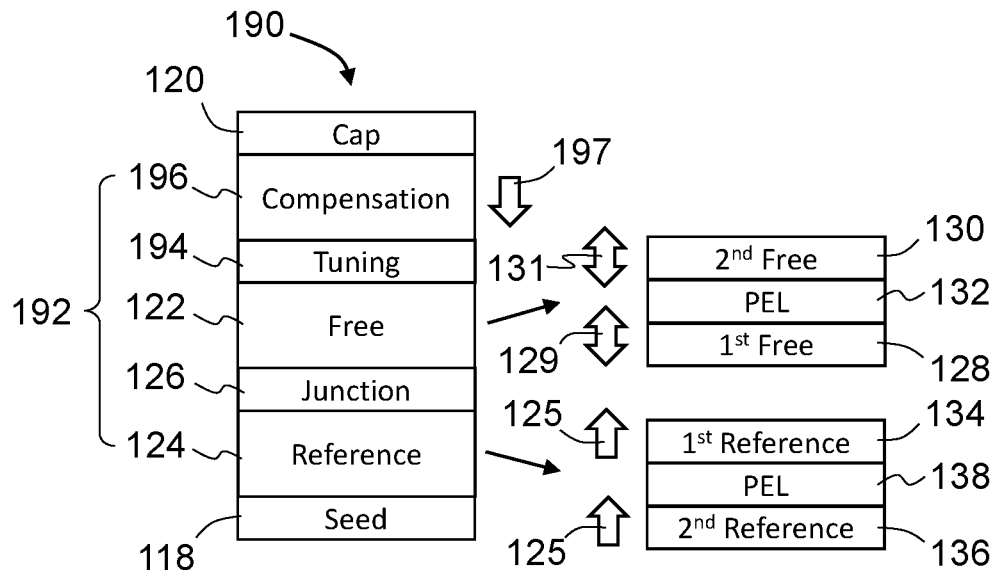
FIGS. 9A and 9B are cross-sectional views of a seventh embodiment of the present invention as applied to a perpendicular MTJ memory element.

A seventh embodiment of the present invention as applied to an MTJ memory element is illustrated in FIG. 9A. The memory element 190 includes a magnetic tunnel junction (MTJ) structure 192 in between an optional seed layer 118 and an optional cap layer 120. The MTJ structure 192 comprises a magnetic free layer structure 122 and a magnetic reference layer structure 124 with an insulating tunnel junction layer 126 interposed therebetween, a tuning layer 194 formed adjacent to the magnetic free layer structure 122, and a magnetic compensation layer 196 formed adjacent to the tuning layer 194. The magnetic reference layer structure 124 and the magnetic compensation layer 196 may be formed adjacent to the optional seed layer 118 and cap layer 120, respectively. The memory element 190 of FIG. 9A is different from the memory element 114 of FIG. 3A in that the tuning layer 194 and the magnetic compensation layer 196 have been inserted in between the magnetic free layer structure 122 and the optional cap layer 120.

The magnetic free layer structure 122 includes a first magnetic free layer 128 formed adjacent to the insulating tunnel junction layer 126 and a second magnetic free layer 130 separated from the first magnetic free layer 128 by a first perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer structure 124 includes a first magnetic reference layer 134 formed adjacent to the insulating tunnel junction layer 126 and a second magnetic reference layer 136 separated from the first magnetic reference layer 134 by a second perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic compensation layer 196 has a third fixed magnetization direction 197 that is substantially perpendicular to the layer plane thereof and is substantially opposite to the first fixed magnetization direction 125. The magnetic compensation layer 196 may comprise one or more magnetic sublayers having the third fixed magnetization direction 197.

Figure 9B:
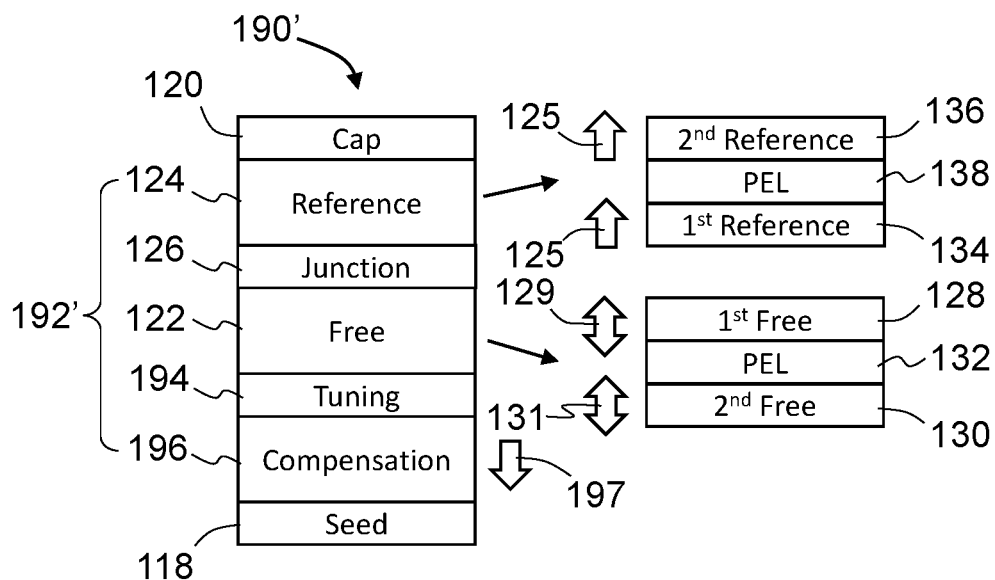

The stacking order of the individual layers in the MTJ structure 192 of the memory element 190 may be inverted as illustrated in FIG. 9B without affecting the device performance. The memory element 190' of FIG. 9B has an MTJ structure 192' that has the same layers but with the inverted stacking order comparing to the MTJ structure 192. Accordingly, the magnetic compensation layer 196 and the magnetic reference layer structure 124 may be formed adjacent to the optional seed layer 118 and cap layer 120, respectively.

Figure 10A:
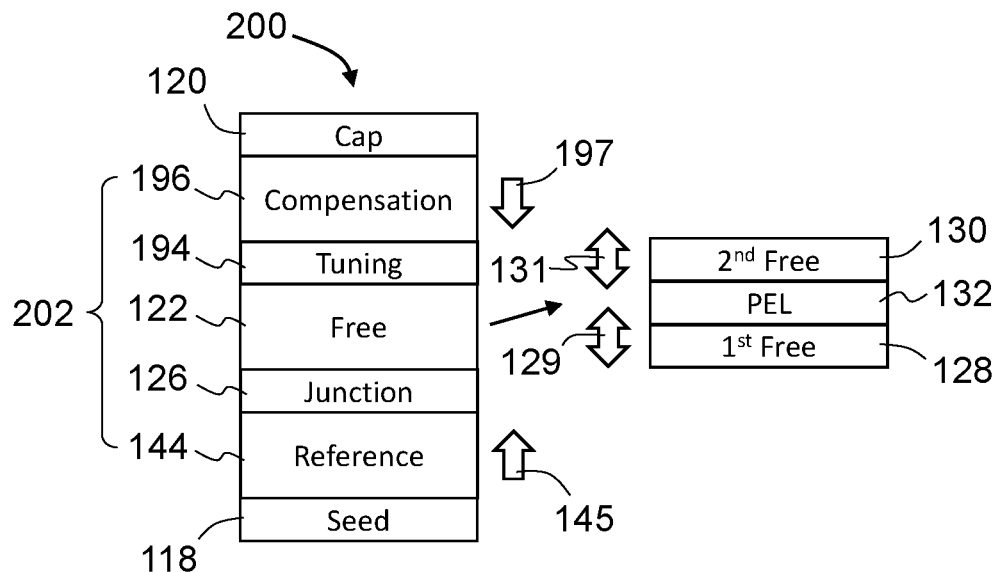
FIGS. 10A and 10B are cross-sectional views of an eighth embodiment of the present invention as applied to a perpendicular MTJ memory element.

An eighth embodiment of the present invention as applied to an MTJ memory element is illustrated in FIG. 10A. The memory element 200 includes a magnetic tunnel junction (MTJ) structure 202 in between an optional seed layer 118 and an optional cap layer 120. The MTJ structure 202 comprises a magnetic free layer structure 122 and a magnetic reference layer 144 with an insulating tunnel junction layer 126 interposed therebetween, a tuning layer 194 formed adjacent to the magnetic free layer structure 122, and a magnetic compensation layer 196 formed adjacent to the tuning layer 194. The magnetic reference layer 144 and the magnetic compensation layer 196 may be formed adjacent to the optional seed layer 118 and cap layer 120, respectively. The memory element 200 of FIG. 10A is different from the memory element 140 of FIG. 4A in that the tuning layer 194 and the magnetic compensation layer 196 have been inserted in between the magnetic free layer structure 122 and the optional cap layer 120.

The magnetic free layer structure 122 includes a first magnetic free layer 128 formed adjacent to the insulating tunnel junction layer 126 and a second magnetic free layer 130 separated from the first magnetic free layer 128 by a perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer 144 has a first fixed magnetization direction 145 substantially perpendicular to the layer plane thereof. The magnetic reference layer 144 may comprise one or more magnetic sublayers having the first fixed magnetization direction 145.

The magnetic compensation layer 196 has a third fixed magnetization direction 197 that is substantially perpendicular to the layer plane thereof and is substantially opposite to the first fixed magnetization direction 145. The magnetic compensation layer 196 may comprise one or more magnetic sublayers having the third fixed magnetization direction 197.

Figure 10B:
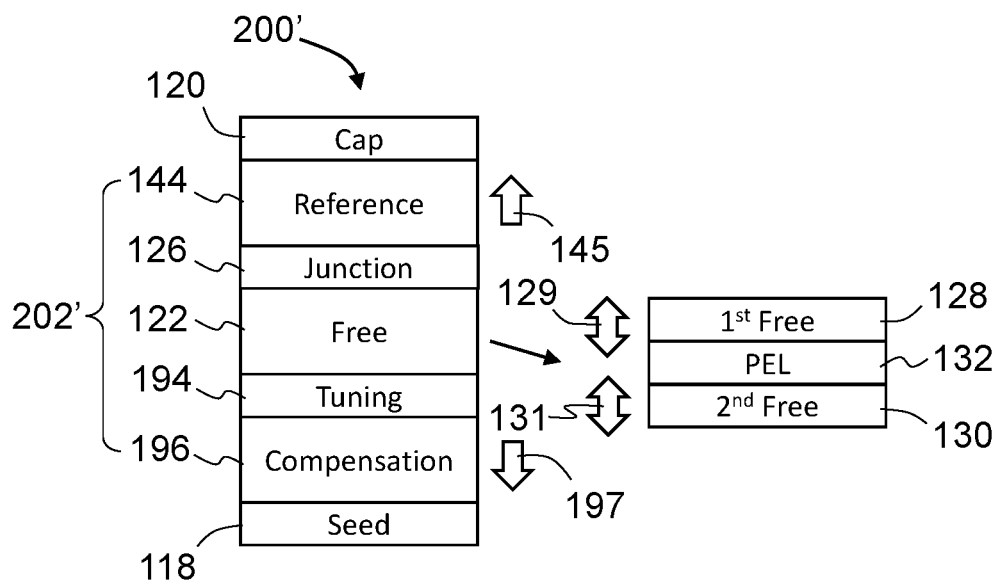

The stacking order of the individual layers in the MTJ structure 202 of the memory element 200 may be inverted as illustrated in FIG. 10B without affecting the device performance. The memory element 200' of FIG. 10B has an MTJ structure 202' that has the same layers but with the inverted stacking order comparing to the MTJ structure 202. Accordingly, the magnetic compensation layer 196 and the magnetic reference layer 144 may be formed adjacent to the optional seed layer 118 and cap layer 120, respectively.

Figure 11A:
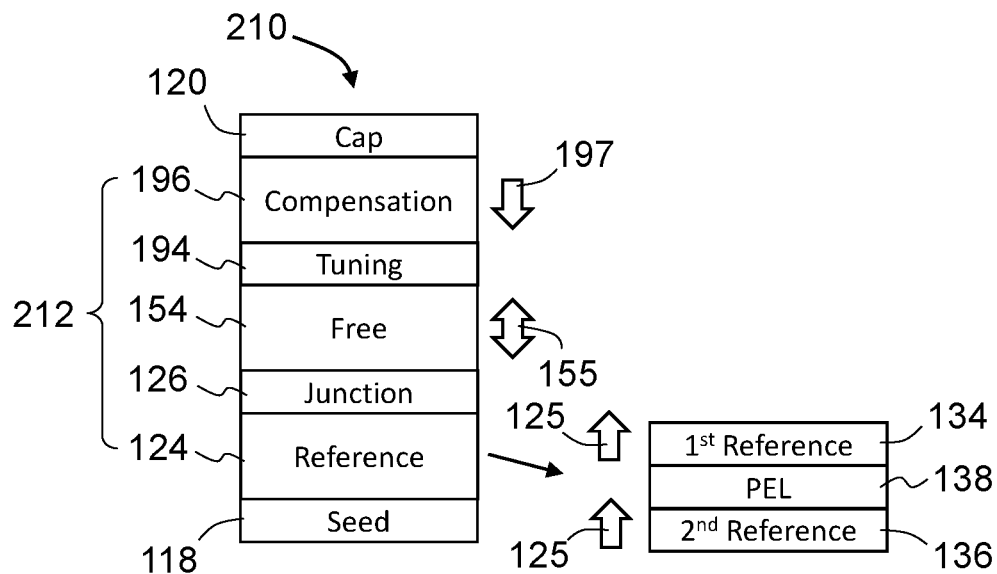
FIGS. 11A and 11B are cross-sectional views of a ninth embodiment of the present invention as applied to a perpendicular MTJ memory element.

A ninth embodiment of the present invention as applied to an MTJ memory element is illustrated in FIG. 11A. The memory element 210 includes a magnetic tunnel junction (MTJ) structure 212 in between an optional seed layer 118 and an optional cap layer 120. The MTJ structure 212 comprises a magnetic free layer 154 and a magnetic reference layer structure 124 with an insulating tunnel junction layer 126 interposed therebetween, a tuning layer 194 formed adjacent to the magnetic free layer 154, and a magnetic compensation layer 196 formed adjacent to the tuning layer 194. The magnetic reference layer structure 124 and the magnetic compensation layer 196 may be formed adjacent to the optional seed layer 118 and cap layer 120, respectively. The memory element 210 of FIG. 11A is different from the memory element 150 of FIG. 5A in that the tuning layer 194 and the magnetic compensation layer 196 have been inserted in between the magnetic free layer 154 and the optional cap layer 120.

The magnetic free layer 154 has a variable magnetization direction 155 substantially perpendicular to the layer plane thereof. The magnetic free layer 154 may comprise one or more magnetic sublayers having the variable magnetization direction 155.

The magnetic reference layer structure 124 includes a first magnetic reference layer 134 formed adjacent to the insulating tunnel junction layer 126 and a second magnetic reference layer 136 separated from the first magnetic reference layer 134 by a perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic compensation layer 196 has a third fixed magnetization direction 197 that is substantially perpendicular to the layer plane thereof and is substantially opposite to the first fixed magnetization direction 125. The magnetic compensation layer 196 may comprise one or more magnetic sublayers having the third fixed magnetization direction 197.

Figure 11B:
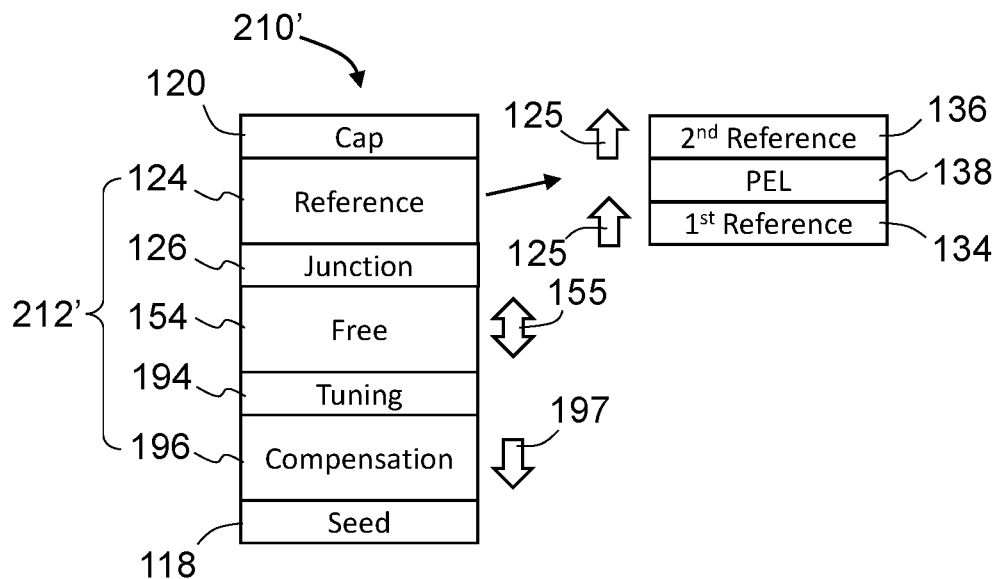

The stacking order of the individual layers in the MTJ structure 212 of the memory element 210 may be inverted as illustrated in FIG. 11B without affecting the device performance. The memory element 210' of FIG. 11B has an MTJ structure 212' that has the same layers but with the inverted stacking order comparing to the MTJ structure 212. Accordingly, the magnetic compensation layer 196 and the magnetic reference layer structure 124 may be formed adjacent to the optional seed layer 118 and cap layer 120, respectively.

Comparing with the MTJ structures 116, 116', 142, 142', 152, and 152' of FIGS. 3A/B-5A/B, respectively, the MTJ structures 192, 192', 202, 202', 212, and 212' of FIGS. 9A/B-11A/B, respectively, have the magnetic compensation layer 196 separated from the magnetic free layer structure 122 or the magnetic free layer 154 by the tuning layer 194. Similar to the magnetic fixed layer 166, the magnetic compensation layer 196 is not an "active" layer like the magnetic reference layer structure 124 and the magnetic free layer structure 122, which along with the tunnel junction layer 126 collectively form an MTJ that changes resistivity when a spin-polarized current pass therethrough. One of the functions of the magnetic compensation layer 196, which has an opposite magnetization direction compared with the magnetic reference layer structure 124 and the magnetic reference layer 144, is to cancel, as much as possible, the external magnetic field exerted by the magnetic reference layer structure 124 or the magnetic reference layer 144 on the magnetic free layer structures 122 or the magnetic free layer 154, thereby minimizing the offset field or net external field in the magnetic free layer structures 122 or the magnetic free layer 154. The strength of the external magnetic field exerted by the magnetic compensation layer 196 on the magnetic free layer structure 122 or the magnetic free layer 154 can be modulated by varying the thickness of the tuning layer 194, which changes the separation distance between the magnetic compensation layer 196 and the magnetic free layer structure 122 or the magnetic free layer 154.

The tuning layer 194 may also improve the perpendicular anisotropy of the magnetic layers formed adjacent thereto. The tuning layer 194 may comprise one or more tuning sublayers, which may be formed adjacent to each other.

Figure 12A:
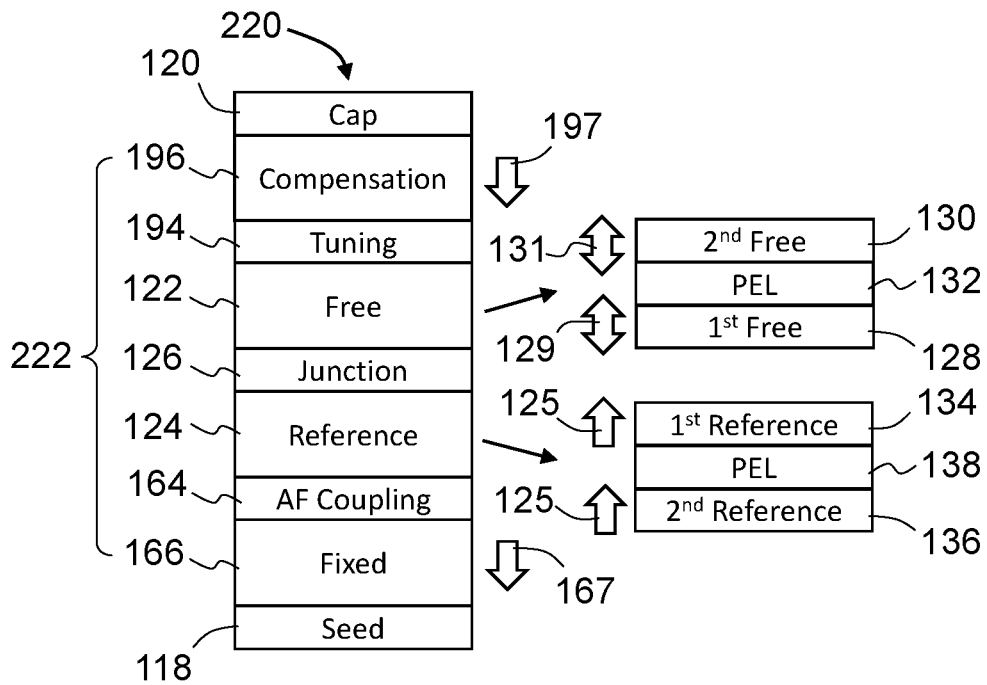
FIGS. 12A and 12B are cross-sectional views of a tenth embodiment of the present invention as applied to a perpendicular MTJ memory element.

A tenth embodiment of the present invention as applied to a perpendicular MTJ memory element is illustrated in FIG. 12A. The memory element 220 includes a magnetic tunnel junction (MTJ) structure 222 in between an optional seed layer 118 and an optional cap layer 120. The MTJ structure 222 comprises a magnetic free layer structure 122 and a magnetic reference layer structure 124 with an insulating tunnel junction layer 126 interposed therebetween, a tuning layer 194 formed adjacent to the magnetic free layer structure 122 opposite the insulating tunnel junction layer 126, a magnetic compensation layer 196 formed adjacent to the tuning layer 194 opposite the magnetic free layer structure 122, an anti-ferromagnetic coupling layer 164 formed adjacent to the magnetic reference layer structure 124 opposite the insulating tunnel junction layer 126, and a magnetic fixed layer 166 formed adjacent to the anti-ferromagnetic coupling layer 164 opposite the magnetic reference layer structure 124. The magnetic fixed layer 166 and the magnetic compensation layer 196 may be formed adjacent to the optional seed layer 118 and cap layer 120, respectively. The memory element 220 of FIG. 12A is different from the memory element 190 of FIG. 9A in that the magnetic fixed layer 166 and the anti-ferromagnetic coupling layer 164 have been inserted in between the magnetic reference layer structure 124 and the optional seed layer 118.

The magnetic free layer structure 122 includes a first magnetic free layer 128 formed adjacent to the insulating tunnel junction layer 126 and a second magnetic free layer 130 separated from the first magnetic free layer 128 by a first perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer structure 124 includes a first magnetic reference layer 134 formed adjacent to the insulating tunnel junction layer 126 and a second magnetic reference layer 136 separated from the first magnetic reference layer 134 by a second perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic compensation layer 196 has a third fixed magnetization direction 197 that is substantially perpendicular to the layer plane thereof and is substantially opposite to the first fixed magnetization direction 125. The magnetic compensation layer 196 may comprise one or more magnetic sublayers having the third fixed magnetization direction 197.

The magnetic fixed layer 166 has a second fixed magnetization direction 167 that is substantially perpendicular to the layer plane thereof and is substantially opposite to the first fixed magnetization direction 125. The magnetic fixed layer 166 may comprise one or more magnetic sublayers having the second fixed magnetization direction 167.

Figure 12B:
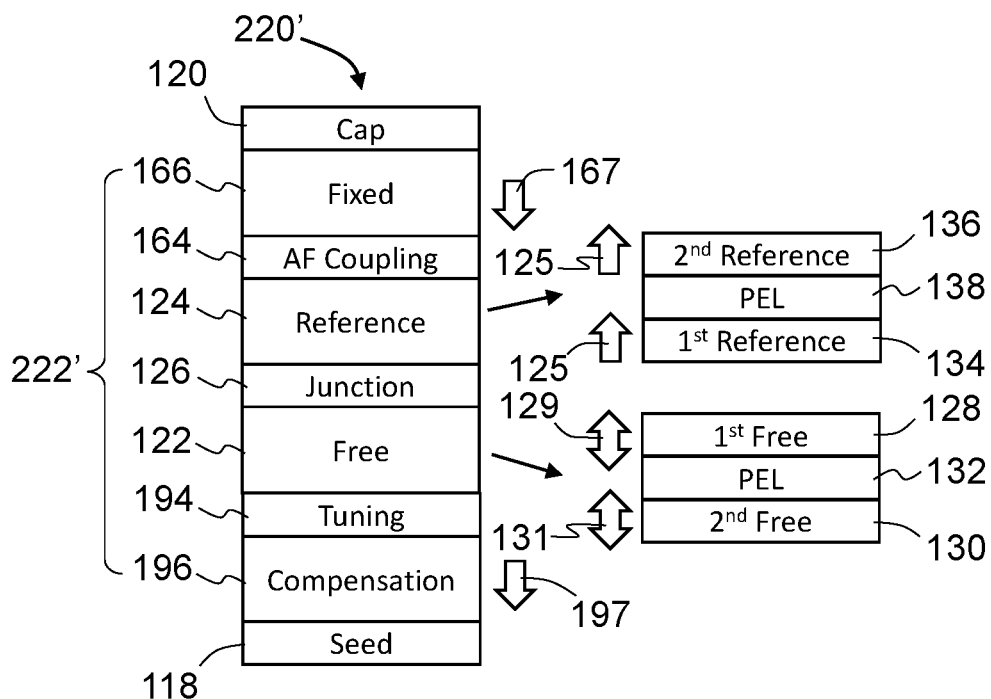

The stacking order of the individual layers in the MTJ structure 222 of the memory element 220 may be inverted as illustrated in FIG. 12B without affecting the device performance. The memory element 220' of FIG. 12B has an MTJ structure 222' that has the same layers but with the inverted stacking order comparing with the MTJ structure 222. Accordingly, the magnetic compensation layer 196 and the magnetic fixed layer 166 may be formed adjacent to the optional seed layer 118 and cap layer 120, respectively.

Figure 13A:
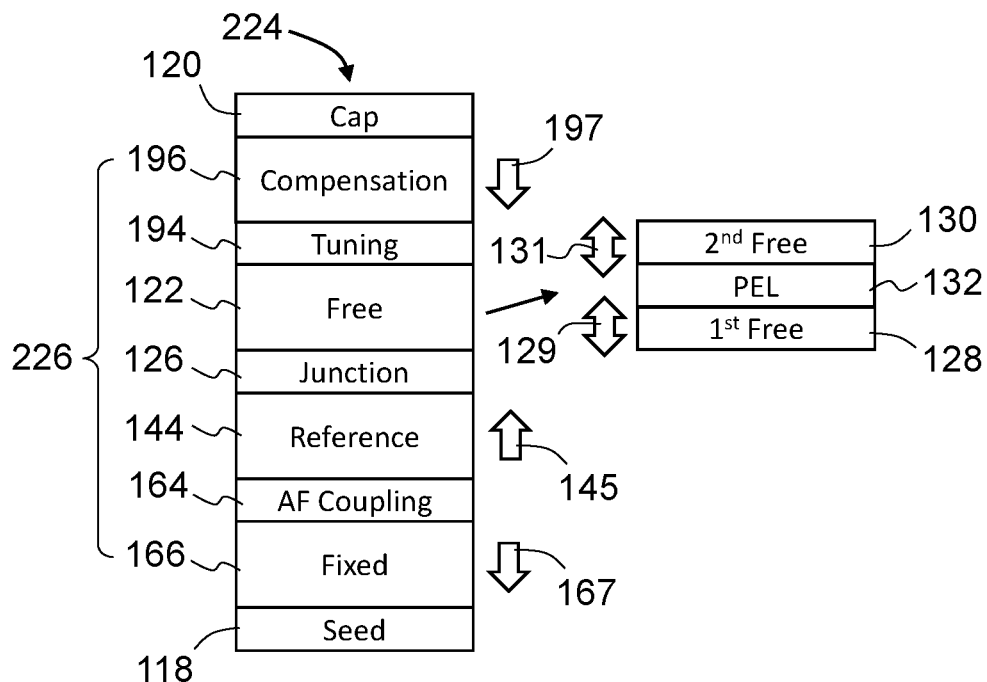
FIGS. 13A and 13B are cross-sectional views of an eleventh embodiment of the present invention as applied to a perpendicular MTJ memory element.

An eleventh embodiment of the present invention as applied to a perpendicular MTJ memory element is illustrated in FIG. 13A. The memory element 224 includes a magnetic tunnel junction (MTJ) structure 226 in between an optional seed layer 118 and an optional cap layer 120. The MTJ structure 226 comprises a magnetic free layer structure 122 and a magnetic reference layer 144 with an insulating tunnel junction layer 126 interposed therebetween, a tuning layer 194 formed adjacent to the magnetic free layer structure 122 opposite the insulating tunnel junction layer 126, a magnetic compensation layer 196 formed adjacent to the tuning layer 194 opposite the magnetic free layer structure 122, an anti-ferromagnetic coupling layer 164 formed adjacent to the magnetic reference layer 144 opposite the insulating tunnel junction layer 126, and a magnetic fixed layer 166 formed adjacent to the anti-ferromagnetic coupling layer 164 opposite the magnetic reference layer 144. The magnetic fixed layer 166 and the magnetic compensation layer 196 may be formed adjacent to the optional seed layer 118 and cap layer 120, respectively. The memory element 224 of FIG. 13A is different from the memory element 200 of FIG. 10A in that the magnetic fixed layer 166 and the anti-ferromagnetic coupling layer 164 have been inserted in between the magnetic reference layer 144 and the optional seed layer 118.

The magnetic free layer structure 122 includes a first magnetic free layer 128 formed adjacent to the insulating tunnel junction layer 126 and a second magnetic free layer 130 separated from the first magnetic free layer 128 by a perpendicular enhancement layer (PEL) 132. The first and the second magnetic free layers 128 and 130 have respectively first and second variable magnetization directions 129 and 131 substantially perpendicular to the layer planes thereof. The first magnetic free layer 128 may comprise one or more magnetic sublayers having the first variable magnetization direction 129. Likewise, the second magnetic free layer 130 may comprise one or more magnetic sublayers having the second variable magnetization direction 131. The first and the second variable magnetization directions 129 and 131 may be parallel or anti-parallel to each other.

The magnetic reference layer 144 has a first fixed magnetization direction 145 substantially perpendicular to the layer plane thereof. The magnetic reference layer 144 may comprise one or more magnetic sublayers having the first fixed magnetization direction 145.

The magnetic compensation layer 196 has a third fixed magnetization direction 197 that is substantially perpendicular to the layer plane thereof and is substantially opposite to the first fixed magnetization direction 145. The magnetic compensation layer 196 may comprise one or more magnetic sublayers having the third fixed magnetization direction 197.

The magnetic fixed layer 166 has a second fixed magnetization direction 167 that is substantially perpendicular to the layer plane thereof and is substantially opposite to the first fixed magnetization direction 145. The magnetic fixed layer 166 may comprise one or more magnetic sublayers having the second fixed magnetization direction 167.

Figure 13B:
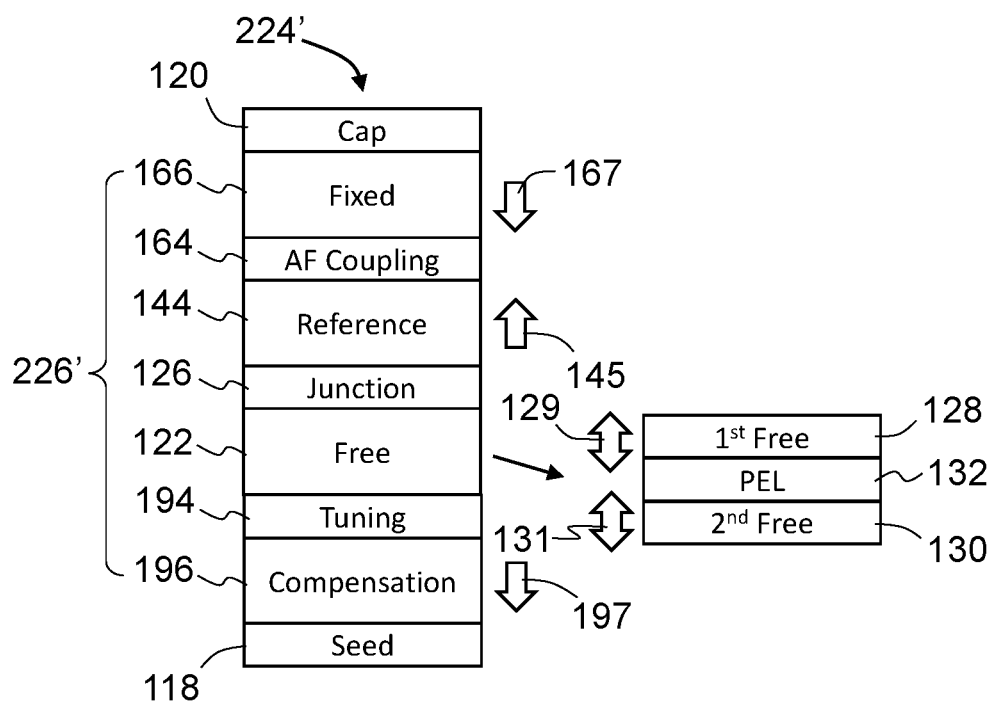

The stacking order of the individual layers in the MTJ structure 226 of the memory element 224 may be inverted as illustrated in FIG. 13B without affecting the device performance. The memory element 224' of FIG. 13B has an MTJ structure 226' that has the same layers but with the inverted stacking order comparing to the MTJ structure 226. Accordingly, the magnetic compensation layer 196 and the magnetic fixed layer 166 may be formed adjacent to the optional seed layer 118 and cap layer 120, respectively.

Figure 14A:
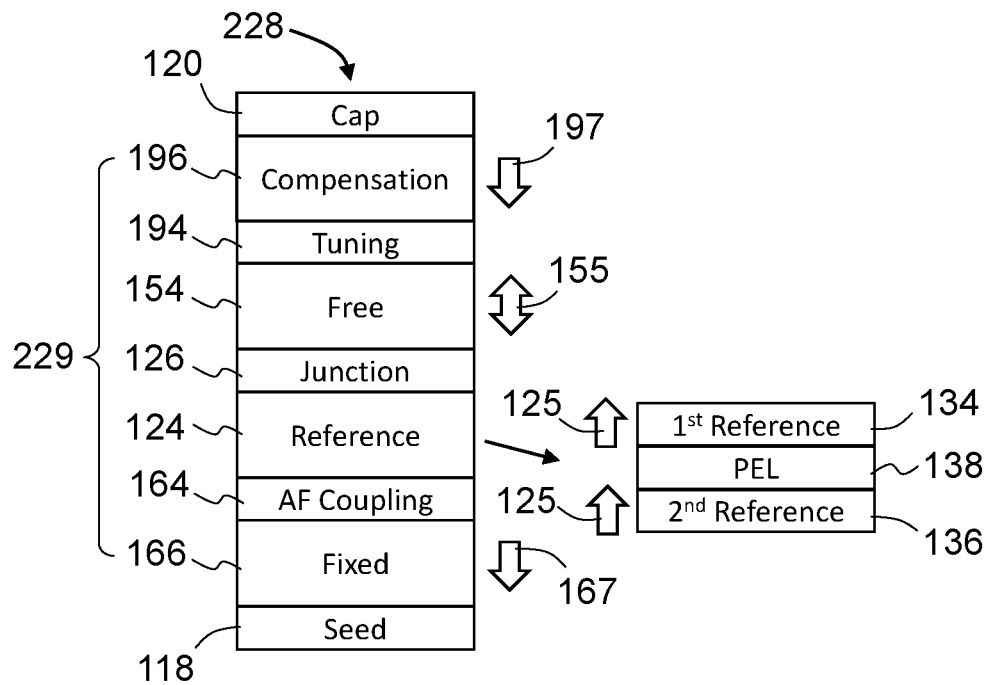
FIGS. 14A and 14B are cross-sectional views of a twelfth embodiment of the present invention as applied to a perpendicular MTJ memory element.

A twelfth embodiment of the present invention as applied to a perpendicular MTJ memory element is illustrated in FIG. 14A. The memory element 228 includes a magnetic tunnel junction (MTJ) structure 229 in between an optional seed layer 118 and an optional cap layer 120. The MTJ structure 229 comprises a magnetic free layer 154 and a magnetic reference layer structure 124 with an insulating tunnel junction layer 126 interposed therebetween, a tuning layer 194 formed adjacent to the magnetic free layer 154 opposite the insulating tunnel junction layer 126, a magnetic compensation layer 196 formed adjacent to the tuning layer 194 opposite the magnetic free layer 154, an anti-ferromagnetic coupling layer 164 formed adjacent to the magnetic reference layer structure 124 opposite the insulating tunnel junction layer 126, and a magnetic fixed layer 166 formed adjacent to the anti-ferromagnetic coupling layer 164 opposite the magnetic reference layer structure 124. The magnetic fixed layer 166 and the magnetic compensation layer 196 may be formed adjacent to the optional seed layer 118 and cap layer 120, respectively. The memory element 228 of FIG. 14A is different from the memory element 210 of FIG. 11A in that the magnetic fixed layer 166 and the anti-ferromagnetic coupling layer 164 have been inserted in between the magnetic reference layer structure 124 and the optional seed layer 118.

The magnetic free layer 154 has a variable magnetization direction 155 substantially perpendicular to the layer plane thereof. The magnetic free layer 154 may comprise one or more magnetic sublayers having the variable magnetization direction 155.

The magnetic reference layer structure 124 includes a first magnetic reference layer 134 formed adjacent to the insulating tunnel junction layer 126 and a second magnetic reference layer 136 separated from the first magnetic reference layer 134 by a perpendicular enhancement layer 138. The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125.

The magnetic compensation layer 196 has a third fixed magnetization direction 197 that is substantially perpendicular to the layer plane thereof and is substantially opposite to the first fixed magnetization direction 125. The magnetic compensation layer 196 may comprise one or more magnetic sublayers having the third fixed magnetization direction 197.

The magnetic fixed layer 166 has a second fixed magnetization direction 167 that is substantially perpendicular to the layer plane thereof and is substantially opposite to the first fixed magnetization direction 125. The magnetic fixed layer 166 may comprise one or more magnetic sublayers having the second fixed magnetization direction 167.

Figure 14B:
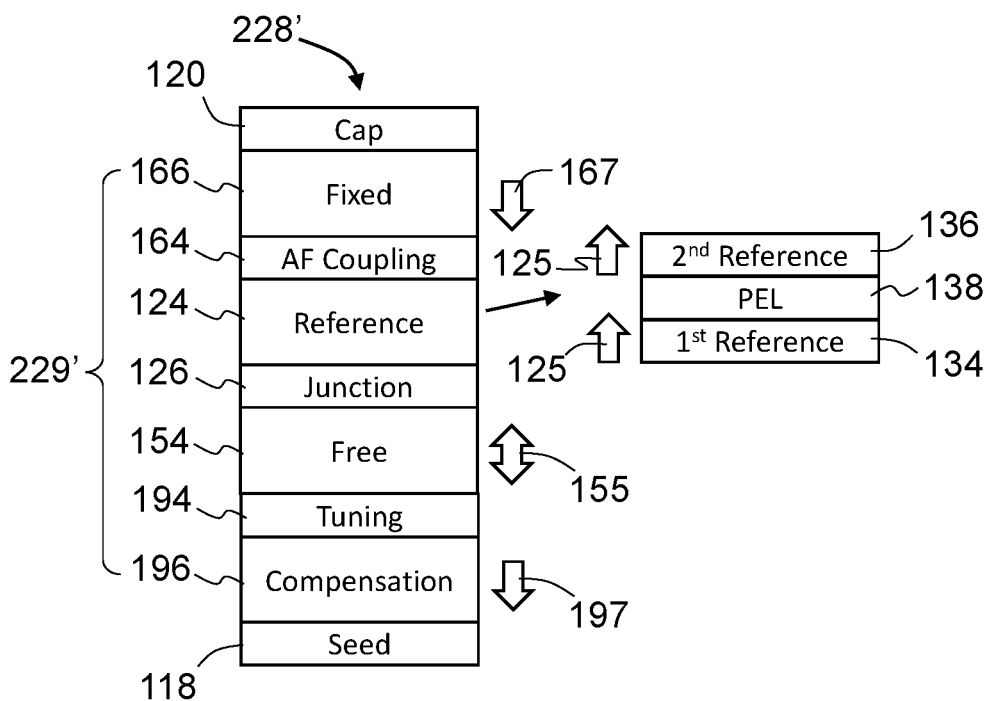

The stacking order of the individual layers in the MTJ structure 229 of the memory element 228 may be inverted as illustrated in FIG. 14B without affecting the device performance. The memory element 228' of FIG. 14B has an MTJ structure 229' that has the same layers but with the inverted stacking order comparing to the MTJ structure 229. Accordingly, the magnetic compensation layer 196 and the magnetic fixed layer 166 may be formed adjacent to the optional seed layer 118 and cap layer 120, respectively.

The magnetic free layers 128, 130, and 154, the magnetic reference layers 134, 136, and 144, the magnetic fixed layer 166, and the magnetic compensation layer 196 of above embodiments may be made of any suitable magnetic material or structure. One or more of the magnetic layers 128, 130, 134, 136, 144, 154, 166, and 196 may comprise at least one ferromagnetic element, such as but not limited to cobalt (Co), nickel (Ni), or iron (Fe), to form a suitable magnetic material, such as but not limited to Co, Ni, Fe, CoNi, CoFe, NiFe, or CoNiFe. The magnetic material of the one or more of the magnetic layers 128, 130, 134, 136, 144, 154, 166, and 196 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), or phosphorus (P), to form a magnetic alloy or compound, such as but not limited to cobalt-iron-boron (CoFeB), iron-platinum (FePt), cobalt-platinum (CoPt), cobalt-platinum-chromium (CoPtCr), cobalt-iron-boron-titanium (CoFeBTi), cobalt-iron-boron-zirconium, (CoFe- BZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 126. CoFeB alloy used for one or more of the magnetic layers 128, 130, 134, 136, 144, 154, 166, and 196 may contain more than 40 atomic percent Fe or may contain less than 30 atomic percent B or both.

The first magnetic reference layer 134 may be made of a magnetic material comprising Co, Fe, and B with a thickness in the range of about 0.6 nm to about 1.8 nm, while the second magnetic reference layer 136 may be made of a material comprising Co, Fe, and B with a thickness in the range of about 0.6 nm to about 2.0 nm.

One or more of the magnetic layers 128, 130, 134, 136, 144, 154, 166, and 196 may alternatively have a multilayer structure formed by interleaving layers of a first type of material with layers of a second type of material with at least one of the two types of materials being magnetic, such as but not limited to [Co/Pt], [Co/Pd], [Co/Pt(Pd)], [Co/Ni], [CoFe/Pt], [CoFe/Pd], [CoFe/Pt(Pd)], [CoFe/Ni], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 126. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Figure 15A:
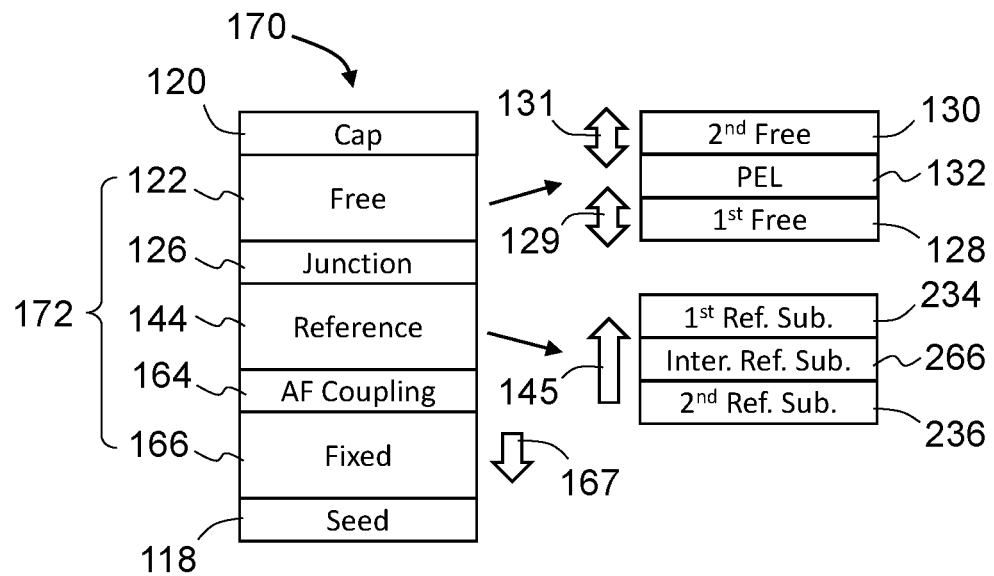
FIGS. 15A and 15B are cross-sectional views of exemplary MTJ structures corresponding to the fifth embodiment of the present invention.
Figure 15B:
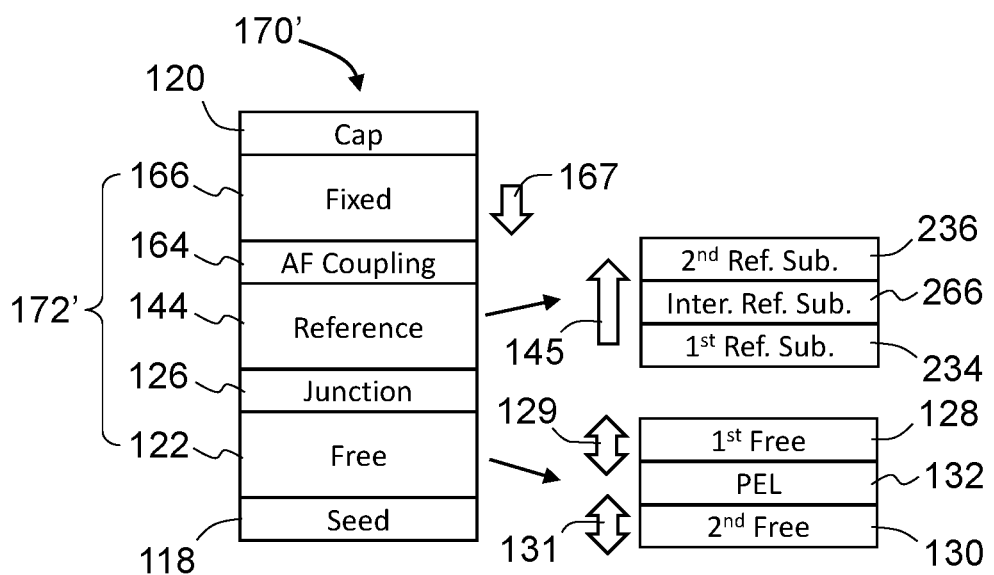

Still alternatively, one or more of the magnetic layers 128, 130, 134, 136, 144, 154, 166, and 196 may comprise two, three, four, or more magnetic sublayers with each magnetic sublayer being made of any suitable magnetic material, including magnetic metal, alloy, compound, or multilayer structure, as described in the preceding paragraphs above. The magnetic sublayers of a magnetic layer may form adjacent to each other and may have the same magnetization direction. For example, the magnetic reference layer 144 of the embodiments of FIGS. 4A, 4B, 7A, 7B, 10A, 10B, 13A, and 13B may further comprise three magnetic sublayers. FIGS. 15A and 15B illustrate the magnetic reference layer 144 of the embodiments of FIGS. 7A and 7B comprising a first magnetic reference sublayer 234 formed adjacent to the insulating tunnel junction layer 126 and a second magnetic reference sublayer 236 separated from the first magnetic reference sublayer 234 by an intermediate magnetic reference sublayer 266. Each of the first, second, and intermediate magnetic reference sublayers 234, 236, and 266 may be made of any suitable magnetic material or structure as described above. The first, second, and intermediate magnetic reference sublayers 234, 236, and 266 have the first fixed magnetization direction 145 substantially perpendicular to the layer planes thereof. Alternatively, the magnetic reference layer 144 of the embodiments of FIGS. 4A, 4B, 7A, 7B, 10A, 10B, 13A, and 13B may include two, four, or more magnetic sublayers, which may form adjacent to each other and may have the same magnetization direction.

Figure 16A:
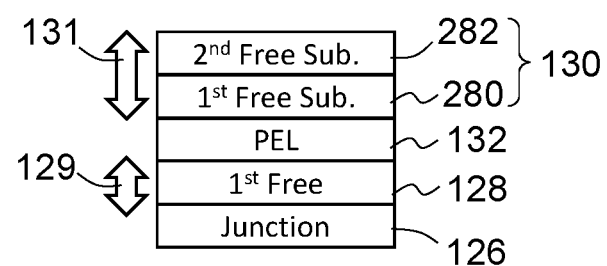
FIGS. 16A and 16B are cross-sectional views of exemplary magnetic free layer structures corresponding to various embodiments of the present invention.
Figure 16B:
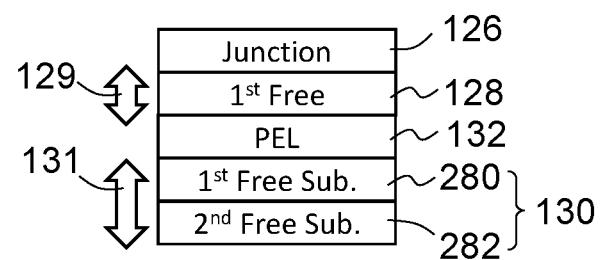

The second magnetic free layer 130 of the embodiments of FIGS. 3A, 3B, 4A, 4B, 6A, 6B, 7A, 7B, 9A, 9B, 10A, 10B, 12A, 12B, 13A, and 13B may further comprise a first magnetic free sublayer 280 formed adjacent to the perpendicular enhancement layer (PEL) 132 and a second magnetic free sublayer 282 formed adjacent to the first magnetic free sublayer 280 opposite the PEL 132 as illustrated in FIGS. 16A and 16B. Each of the first and second magnetic free sublayers 280 and 282 may be made of any suitable magnetic material or structure as described above. The first and second magnetic free sublayers 280 and 282 have the second variable magnetization direction 131. Alternatively, the second magnetic free layer 130 of the embodiments of FIGS. 3A, 3B, 4A, 4B, 6A, 6B, 7A, 7B, 9A, 9B, 10A, 10B, 12A, 12B, 13A, and 13B may include three, four, or more magnetic sublayers, which may form adjacent to each other and have the same magnetization direction.

Figure 17A:
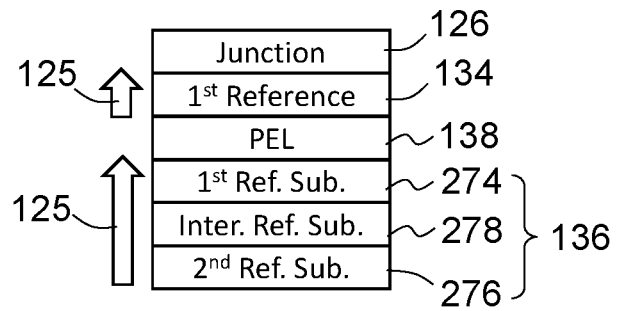
FIGS. 17A and 17B are cross-sectional views of exemplary magnetic reference layer structures corresponding to various embodiments of the present invention.
Figure 17B:
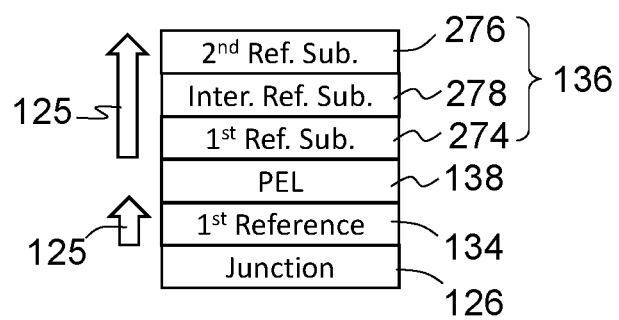

Similarly, the second magnetic reference layer 136 of the embodiments of FIGS. 3A, 3B, 5A, 5B, 6A, 6B, 8A, 8B, 9A, 9B, 11A, 11B, 12A, 12B, 14A and 14B may further comprise a first magnetic reference sublayer 274 formed adjacent to the perpendicular enhancement layer 138 and a second magnetic reference sublayer 276 separated from the first magnetic reference sublayer 274 by an intermediate reference sublayer 278 as illustrated in FIGS. 17A and 17B. The first and second magnetic reference sublayers 274 and 276 have the first fixed magnetization direction 125. The first and second magnetic reference sublayers 274 and 276 each may be made of any suitable magnetic material or structure as described above, such as but not limited to Co or CoFe, and may have a thickness in the range of about 0.2 nm to about 1.2 nm. The intermediate reference sublayer 278 may be made of palladium, platinum, or nickel and may have a thickness in the range of about 0.2 nm to about 1.2 nm. Alternatively, the second magnetic reference layer 136 of the embodiments of FIGS. 3A, 3B, 5A, 5B, 6A, 6B, 8A, 8B, 9A, 9B, 11A, 11B, 12A, 12B, 14A and 14B may include two or more magnetic sublayers, which may form adjacent to each other and have the same magnetization direction.

Figure 18A:
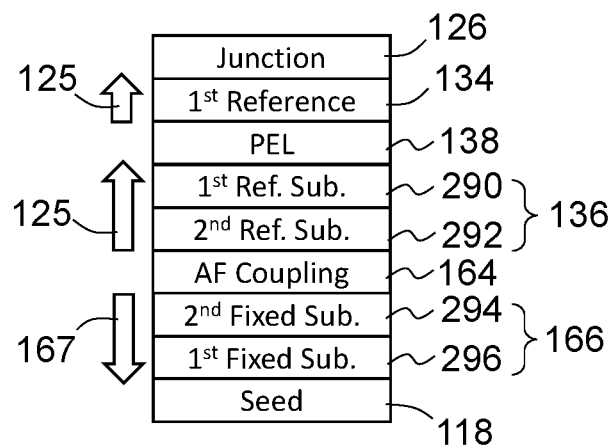
FIGS. 18A and 18B are cross-sectional views of exemplary structures that include magnetic reference layer structure and magnetic fixed layer in accordance with various embodiments of the present invention.
Figure 18B:
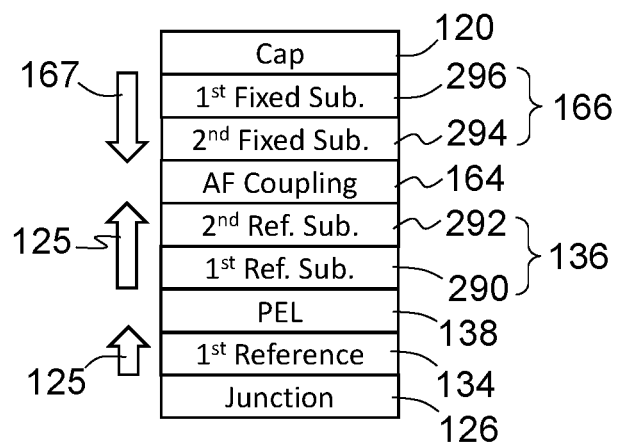

FIGS. 18A and 18B illustrate exemplary structures directed to the embodiments of FIGS. 6A, 6B, 8A, 8B, 12A, 12B, 14A, and 14B in which the second magnetic reference layer 136 comprises a first magnetic reference sublayer 290 formed adjacent to the PEL 138 and a second magnetic reference sublayer 292 formed adjacent to the anti-ferromagnetic coupling layer 164. The first and second magnetic reference sublayers 290 and 292 have the first fixed magnetization direction 125. The magnetic fixed layer 166 in the exemplary structures of FIGS. 18A and 18B may also comprise a second magnetic fixed sublayer 294 formed adjacent to the anti-ferromagnetic coupling layer 164 and a first magnetic fixed sublayer 296 formed adjacent to the second magnetic fixed sublayer 294. The first and second magnetic fixed sublayers 296 and 294 have the second fixed magnetization direction 167 that is substantially opposite to the first fixed magnetization direction 125. One or more of the magnetic sublayers 290-296 may be made of any suitable magnetic material or structure as described above. At least one of the first magnetic reference sublayer 290, the second magnetic reference sublayer 292, the first magnetic fixed sublayer 296, and the second magnetic fixed sublayer 294 may have a multilayer structure, such as but not limited to [Co/Pt], [Co/Pd], [Co/Pt(Pd)], [Co/Ni], [CoFe/Pt], [CoFe/Pd], [CoFe/Pt(Pd)], [CoFe/Ni], or any combination thereof.

In addition to the examples described above, one or more of the magnetic free layer 154, the first magnetic free layer 128, the first magnetic reference layer 134, and the magnetic compensation layer 196 may also comprise two, three, four, or more magnetic sublayers with each magnetic sublayer being made of any suitable magnetic material, including magnetic metal, alloy, compound, or multilayer structure, as described above. The individual magnetic sublayers of a magnetic layer may form adjacent to each other and may have the same magnetization direction.

Figure 19A:
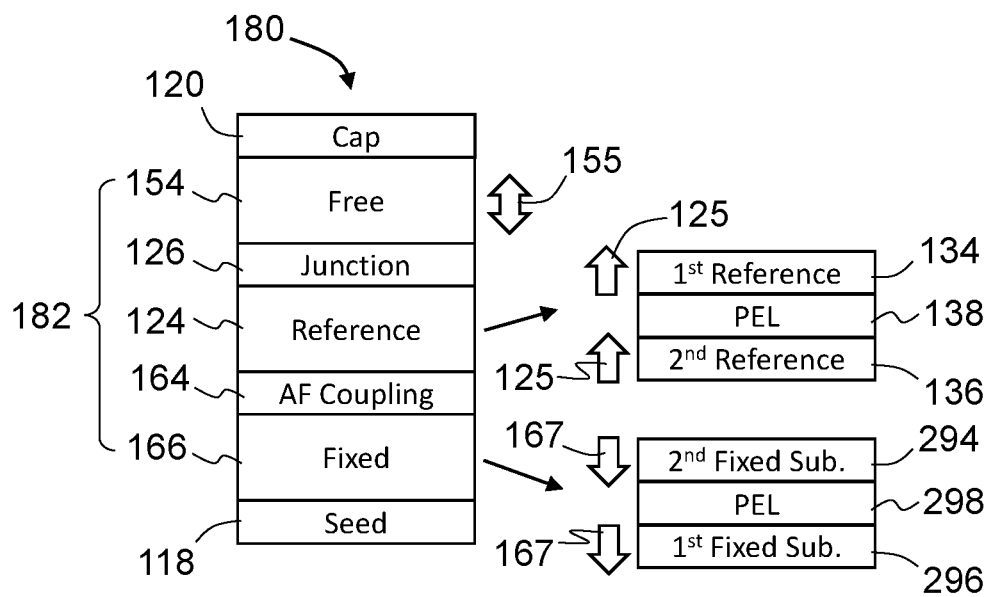
FIGS. 19A and 19B are cross-sectional views of the exemplary MTJ structures in which the magnetic reference layer structure includes the first and second magnetic reference layers without a perpendicular enhancement layer interposed therebetween.
Figure 19B:
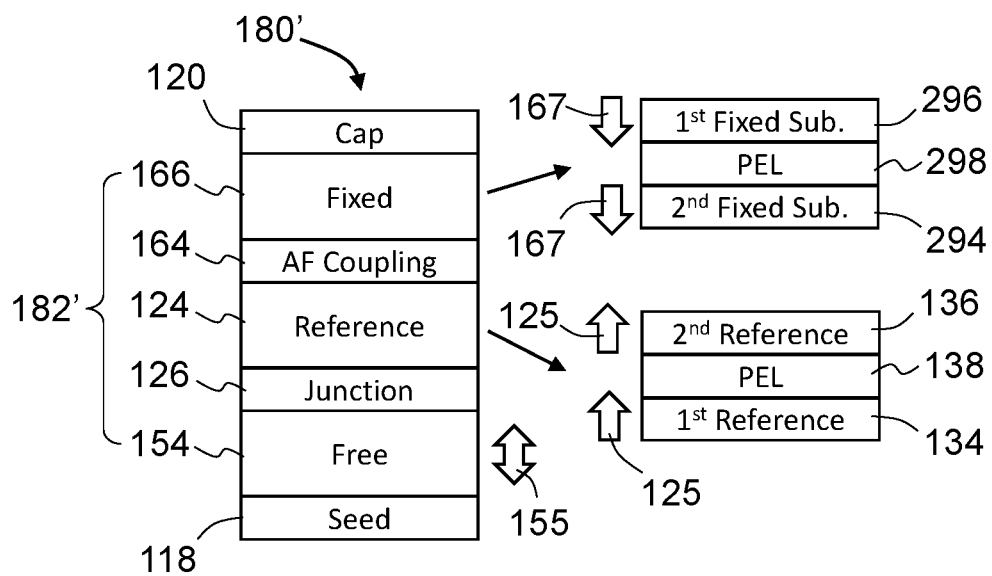

The magnetic fixed layer 166 of the embodiments of FIGS. 6A/B-8A/B, 12A/B-15A/B, and 18A/B may include two or more magnetic sublayers with a perpendicular enhancement layer interposed therebetween. FIGS. 19A and 19B illustrate exemplary structures directed to the embodiment of FIGS. 8A and 8B in which the magnetic fixed layer 166 includes the second magnetic fixed sublayer 294 formed adjacent to the anti-ferromagnetic coupling layer 164 and the first magnetic fixed sublayer 296 separated from the second magnetic fixed sublayer 294 by a perpendicular enhancement layer 298. The first and second magnetic fixed sublayers 296 and 294 have the second fixed magnetization direction 167 that is substantially perpendicular to layer planes thereof and is substantially opposite to the first fixed magnetization direction 125. One or more of the magnetic fixed sublayers 294 and 296 may be made of any suitable magnetic material or structure as described above. At least one of the first and second magnetic fixed sublayers 294 and 296 may have a multilayer structure, such as but not limited to [Co/Pt], [Co/Pd], [Co/Pt(Pd)], [Co/Ni], [CoFe/Pt], [CoFe/Pd], [CoFe/Pt(Pd)], [CoFe/Ni], or any combination thereof.

Figure 20A:
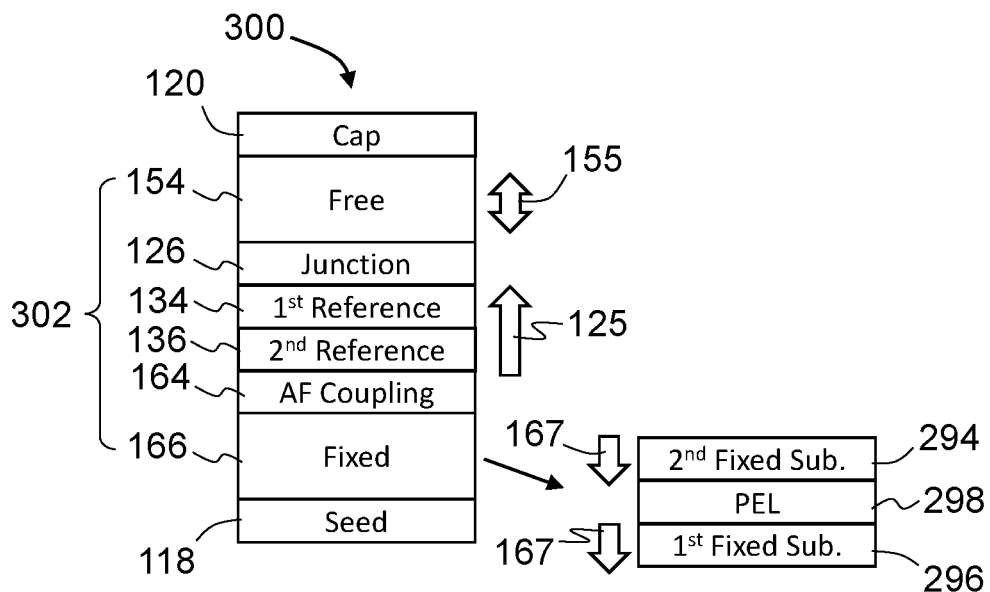
FIGS. 20A and 20B are cross-sectional views of a thirteenth embodiment of the present invention as applied to a perpendicular MTJ memory element.
Figure 20B:
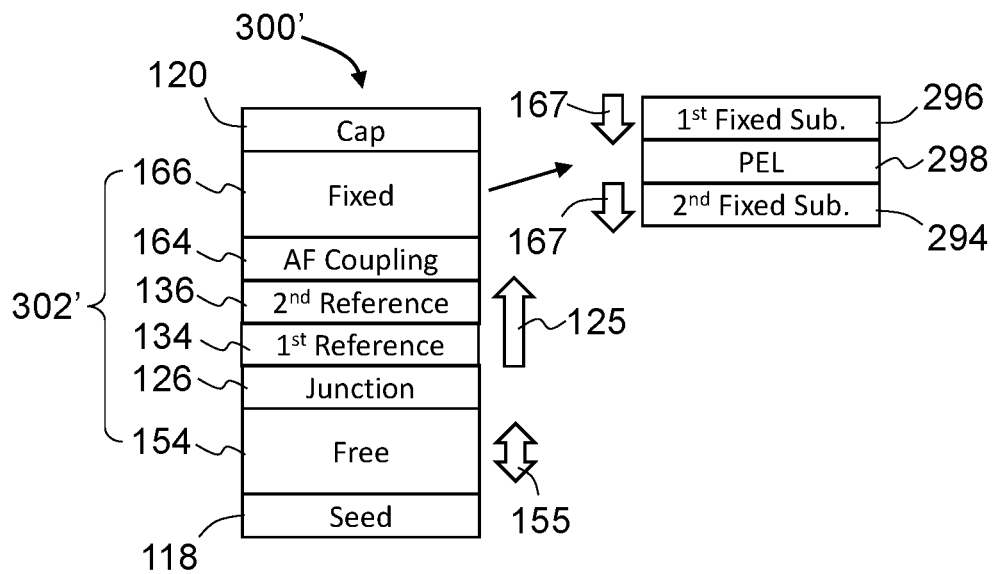

Alternatively, the magnetic reference layer structure 124 of the exemplary structures of FIGS. 19A and 19B may include the first and second magnetic reference layers 134 and 136 without the perpendicular enhancement layer 138 in between, resulting in a thirteenth embodiment as illustrated in FIGS. 20A and 20B. A memory element 300 of FIG. 20A includes a magnetic tunnel junction (MTJ) structure 302 in between the optional seed layer 118 and the optional cap layer 120. The MTJ structure 302 comprises the magnetic free layer 154, the insulating tunnel junction layer 126 formed adjacent thereto, the first magnetic reference layer 134 formed adjacent to the insulating tunnel junction layer 126 opposite the magnetic free layer 154, the second magnetic reference layer 136 formed adjacent to the first magnetic reference layer 134, the anti-ferromagnetic coupling layer 164 formed adjacent to the second magnetic reference layer 136, and the magnetic fixed layer 166 formed adjacent to the anti-ferromagnetic coupling layer 164. The magnetic fixed layer 166 and the magnetic free layer 154 may be formed adjacent to the optional seed layer 118 and cap layer 120, respectively. Like the exemplary structures of FIGS. 19A and 19B, the magnetic fixed layer 166 of the memory element 300 includes the second magnetic fixed sublayer 294 formed adjacent to the anti-ferromagnetic coupling layer 164 and the first magnetic fixed sublayer 296 separated from the second magnetic fixed sublayer 294 by the perpendicular enhancement layer 298.

The magnetic free layer 154 has a variable magnetization direction 155 substantially perpendicular to the layer plane thereof. The magnetic free layer 154 may comprise one or more magnetic free sublayers having the variable magnetization direction 155. The magnetic free layer 154 and the magnetic sublayers thereof, if any, may be made of any suitable magnetic material, including magnetic metal, alloy, compound, or multilayer structure, as described above.

The first and second magnetic reference layers 134 and 136 have a first fixed magnetization direction 125 substantially perpendicular to the layer planes thereof. Each of the first magnetic reference layer 134 and the second magnetic reference layer 136 may comprise one or more magnetic sublayers having the first fixed magnetization direction 125. The first and second magnetic reference layers 134 and 136 and the magnetic sublayers thereof, if any, may be made of any suitable magnetic material, including magnetic metal, alloy, compound, or multilayer structure, as described above.

The first and second magnetic fixed sublayers 296 and 294 have the second fixed magnetization direction 167 that is substantially perpendicular to the layer planes thereof and is substantially opposite to the first fixed magnetization direction 125. One or more of the magnetic fixed sublayers 294 and 296 may be made of any suitable magnetic material, including magnetic metal, alloy, compound, or multilayer structure, as described above. At least one of the first and second magnetic fixed sublayers 294 and 296 may have a multilayer structure, such as but not limited to [Co/Pt], [Co/Pd], [Co/Pt(Pd)], [Co/Ni], [CoFe/Pt], [CoFe/Pd], [CoFe/Pt(Pd)], [CoFe/Ni], or any combination thereof.

The stacking order of the individual layers in the MTJ structure 302 of the memory element 300 may be inverted as illustrated in FIG. 20B without affecting the device performance. The memory element 300' of FIG. 20B has an MTJ structure 302' that has the same layers but with the inverted stacking order comparing to the MTJ structure 302. Accordingly, the magnetic free layer 154 and the magnetic fixed layer 166 may be formed adjacent to the optional seed layer 118 and cap layer 120, respectively.

The second magnetic free layer 130 of the embodiments of FIGS. 3A, 3B, 4A, 4B, 6A, 6B, 7A, 7B, 9A, 9B, 10A, 10B, 12A, 12B, 13A, and 13B may comprise one or more ferromagnetic elements and may have a layer thickness of less than about 2 nm, preferably less than about 1.5 nm, more preferably less than about 1 nm, even more preferably less than about 0.8 nm, still even more preferably between about 0.7 nm and about 0.1 nm. At a thickness of less than about 1.5 nm, the second magnetic free layer 130 may become superparamagnetic or magnetically dead by exhibiting no net magnetic moment in the absence of an external magnetic field. The second magnetic free layer 130 may have any suitable composition that comprises one or more of the following materials: Co, Ni, Fe, CoNi, CoFe, NiFe, CoNiFe, CoFeB, B, Ti, Zr, Hf, V, Nb, Ta, Cr, Mo, W, Al, Si, Ge, Ga, O, N, C, Pt, Pd, Ru, Sm, Nd, and P. Alternatively, the second magnetic free layer 130 may have a nominal composition in which all ferromagnetic elements collectively account for less than about 80 at. %, preferably less than about 60 at. %, more preferably less than about 50 at. %, even more preferably less than about 40 at. %. The second magnetic free layer 130 may become non-magnetic if the total content of the ferromagnetic elements is below a certain threshold.

The insulating tunnel junction layer 126 for all perpendicular MTJ structures of FIGS. 3A/B-20A/B may be formed of a suitable insulating material containing oxygen, nitrogen, or both, such as but not limited to magnesium oxide (MgO), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), silicon oxide ($SiO_x$), silicon nitride ($SiN_x$), or any combination thereof. The insulating tunnel junction layer 126 may have a halite-like cubic lattice structure.

The anti-ferromagnetic coupling layer 164, which anti-ferromagnetically couples the magnetic fixed layer 166 to the magnetic reference layers 136 and 144 in the MTJ structures of FIGS. 6A/B-8A/B, 12A/B-15A/B, and 18A/B-20A/B, may have a single layer structure or may comprise two, three, four, or more sublayers formed adjacent to each other. One or more of the single layer and the multiple sublayers of the anti-ferromagnetic coupling layer 164 may be made of a suitable anti-ferromagnetic coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof.

In cases where one or more of the magnetic fixed layer 166 and the magnetic reference layers 136 and 144 comprise a multilayer structure in which one of the two interleaving material is non-magnetic, such as but not limited to [Co/Pt], [Co/Pd], [Co/Pt(Pd)], [CoFe/Pt], [CoFe/Pd], or [CoFe/Pt(Pd)], an interface multilayer structure in which both of the two interleaving materials are magnetic, such as but not limited to [Co/Ni] or [CoFe/Ni], may be inserted between the multilayer structure and the anti-ferromagnetic coupling layer 164, thereby improving the anti-ferromagnetic coupling between the magnetic fixed layer 166 and the magnetic reference layers 136 and 144. For example, in the structures of FIGS. 18A/B, the first magnetic reference sublayer 290 and the first magnetic fixed sublayer 296 each may have a multilayer structure, such as but not limited to [Co/Pt], [Co/Pd], [Co/Pt(Pd)], [CoFe/Pt], [CoFe/Pd], [CoFe/Pt(Pd)], or any combination thereof. Accordingly, the second magnetic reference sublayer 292 and the second magnetic fixed sublayer 294 each may have a multilayer structure in which both of the two interleaving materials are magnetic, such as but not limited to [Co/Ni] or [CoFe/Ni], for improving the anti-ferromagnetic coupling between the magnetic fixed layer 166 and the magnetic reference layer 136.

At least one of the perpendicular enhancement layers (PELs) 132, 138, and 298 formed in the magnetic free layer structure 122, the magnetic reference layer structure 124, and the magnetic fixed layer 166, respectively, may have a single layer structure or may comprise two, three, four, or more perpendicular enhancement sublayers formed adjacent to each other. One or more of the single layer and the multiple sublayers of the PELs 132, 138, and 298 may have a thickness less than about 3 nm, preferably less than about 2 nm, more preferably less than about 1 nm, even more preferably less than about 0.8 nm, still even more preferably less than about 0.6 nm. One or more of the single layer and the multiple sublayers of the PELs 132, 138, and 298 may comprise one or more of the following chemical elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable perpendicular enhancement material, such as but not limited to B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, MgO, $TiO_x$, $ZrO_x$, $HfO_x$, $VO_x$, $NbO_x$, $TaO_x$, $CrO_x$, $MoO_x$, $WO_x$, $RhO_x$, $NiO_x$, $PdO_x$, $PtO_x$, $CuO_x$, $AgO_x$, $RuO_x$, $SiO_x$, $TiN_x$, $ZrN_x$, $HfN_x$, $VN_x$, $NbN_x$, $TaN_x$, $CrN_x$, $MoN_x$, $WN_x$, $NiN_x$, $PdN_x$, $PtO_x$, $RuN_x$, $SiN_x$, $TiO_xN_y$, $ZrO_xN_y$, $HfO_xN_y$, $VO_xN_y$, $NbO_xN_y$, $TaO_xN_y$, $CrO_xN_y$, $MoO_xN_y$, $WO_xN_y$, $NiO_xN_y$, $PdO_xN_y$, $PtO_xN_y$, $RuO_xN_y$, $SiO_xN_y$, $TiRuO_x$, $ZrRuO_x$, $HfRuO_x$, $VRuO_x$, $NbRuO_x$, $TaRuO_x$, $CrRuO_x$, $MoRuO_x$, $WRuO_x$, $RhRuO_x$, $NiRuO_x$, $PdRuO_x$, $PtRuO_x$, $CuRuO_x$, $AgRuO_x$, CoFeB, CoFe, NiFe, CoFeNi, CoTi, CoZr, CoHf, CoV, CoNb, CoTa, CoFeTa, CoCr, CoMo, CoW, NiCr, NiTi, NiZr, NiHf, NiV, NiNb, NiTa, NiMo, NiW, CoNiTa, CoNiCr, CoNiTi, FeTi, FeZr, FeHf, FeV, FeNb, FeTa, FeCr, FeMo, FeW or any combination thereof. In cases where the perpendicular enhancement material contains one or more ferromagnetic elements, such as Co, Fe, and Ni, the total content of the ferromagnetic elements of the perpendicular enhancement material may be less than the threshold required for becoming magnetic, thereby rendering the material essentially non-magnetic. Alternatively, the perpendicular enhancement material that contains one or more ferromagnetic elements may be very thin, thereby rendering the material paramagnetic or magnetically dead. For example, the PEL 132, 138, or 298 may be made of a single layer of Ta, Hf, or MgO, or a bilayer structure with a Ta sublayer and a Hf sublayer formed adjacent to each other.

The optional seed layer 118 of the embodiments of FIGS. 3A/B-14A/B and 19A/B-20A/B may have a single layer structure or may comprise two, three, four, or more sublayers formed adjacent to each other. One or more of the single layer and the multiple sublayers of the seed layer 118 may have a thickness less than about 3 nm, preferably less than about 2 nm, more preferably less than about 1 nm, even more preferably less than about 0.8 nm, still even more preferably less than about 0.6 nm. One or more of the single layer and the multiple sublayers of the seed layer 118 may comprise one or more of the following chemical elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable seed material such as one of those discussed above for the perpendicular enhancement material. For example, the seed layer 118 may be made of a single layer of MgO, Ta, Hf, W, Mo, Ru, Pt, Pd, NiCr, NiTa, NiTi, or $TaN_x$. Alternatively, the seed layer 118 may have a bilayer structure (Ru/Ta) comprising a Ta sublayer formed adjacent to one of the magnetic layers 144, 154, 166, and 196 or structures 122 and 124 and a Ru sublayer formed beneath the Ta sublayer. Other exemplary bilayer structures (bottom/top), such as Ta/Ru, Ta/Hf, Hf/Ta, Ta/W, W/Ta, Ru/W, W/Ru, MgO/Ta, Ta/MgO, Ru/MgO, Hf/MgO, and W/MgO, may also be used for the seed layer 118. Still alternatively, the seed layer 118 may have a bilayer structure comprising an oxide sublayer, such as MgO, formed adjacent to one of the magnetic layers 144, 154, 166, and 196 or structures 122 and 124 and an underlying, thin conductive sublayer, such as CoFeB which may be non-magnetic or amorphous or both. Additional seed sublayers may further form beneath the exemplary CoFeB/MgO seed layer to form other seed layer structures, such as but not limited to Ru/CoFeB/MgO, Ta/CoFeB/MgO, W/CoFeB/MgO, Hf/CoFeB/MgO, Ta/Ru/CoFeB/MgO, Ru/Ta/CoFeB/MgO, W/Ta/CoFeB/MgO, Ta/W/CoFeB/MgO, W/Ru/CoFeB/MgO, Ru/W/CoFeB/MgO, Hf/Ta/CoFeB/MgO, Ta/Hf/CoFeB/MgO, W/Hf/CoFeB/MgO, Hf/W/CoFeB/MgO, Hf/Ru/CoFeB/MgO, Ru/Hf/CoFeB/MgO, Ta/W/Ru/CoFeB/MgO, Ta/Ru/W/CoFeB/MgO, and Ru/Ta/Ru/CoFeB/MgO. Still alternatively, the seed layer 118 may have a multilayer structure formed by interleaving seed sublayers of a first type with seed sublayers of a second type. One or both types of the seed sublayers may comprise one or more ferromagnetic elements, such as Co, Fe, and Ni. One or both types of seed sublayers may be amorphous or noncrystalline. For example, the first and second types of sublayers may be made of Ta and CoFeB, both of which may be amorphous. Moreover, one of the Ta sublayers may be formed adjacent to the one of the magnetic layers 144, 154, 166, and 196 or structures 122 and 124 and the CoFeB sublayers may be non-magnetic or superparamagnetic.

The optional cap layer 120 of the embodiments of FIGS. 3A/B-14A/B and 19A/B-20A/B may have a single layer structure or may comprise two, three, four, or more sublayers formed adjacent to each other. One or more of the single layer and the multiple sublayers of the cap layer 120 may have a thickness less than about 3 nm, preferably less than about 2 nm, more preferably less than about 1 nm, even more preferably less than about 0.8 nm, still even more preferably less than about 0.6 nm. One or more of the single layer and the multiple sublayers of the cap layer 120 may comprise one or more of the following chemical elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, 0, N, and C, thereby forming a suitable cap material such as one of those discussed above for the perpendicular enhancement material. For example, the cap layer 120 may be made of a single layer of MgO, Ta, Hf, W, Mo, Ru, Pt, or Pd. Alternatively, the cap layer 120 may have a bilayer structure (W/Ta) comprising a W sublayer formed adjacent to one of the magnetic layers 144, 154, 166, and 196 or structures 122 and 124 and a Ta sublayer formed on top of the W sublayer. Other exemplary bilayer structures (bottom/top), such as Ta/Ru, Ru/Ta, Ta/Hf, Hf/Ta, Ta/W, Ru/W, W/Ru, MgO/Ta, Ta/MgO, MgO/Ru, MgO/Hf, and MgO/W, may also be used for the cap layer 120. Still alternatively, the cap layer 120 may have a bilayer structure comprising an oxide sublayer, such as MgO, formed adjacent to one of the magnetic layers 144, 154, 166, and 196 or structures 122 and 124 and a thin conductive sublayer, such as CoFeB which may be non-magnetic or superparamagnetic. Additional cap sublayers may further form on top of the exemplary MgO/CoFeB cap layer to form other cap layer structures, such as but not limited to MgO/CoFeB/Ru, MgO/CoFeB/Ta, MgO/CoFeB/W, MgO/CoFeB/Hf, MgO/CoFeB/Ru/Ta, MgO/CoFeB/Ta/Ru, MgO/CoFeB/W/Ta, MgO/CoFeB/Ta/W, MgO/CoFeB/W/Ru, MgO/CoFeB/Ru/W, MgO/CoFeB/Hf/Ta, MgO/CoFeB/Ta/Hf, MgO/CoFeB/Hf/W, MgO/CoFeB/W/Hf, MgO/CoFeB/Hf/Ru, MgO/CoFeB/Ru/Hf, MgO/CoFeB/Ru/W/Ta, MgO/CoFeB/W/Ru/Ta, and MgO/CoFeB/Ru/Ta/Ru. As such, the cap layer 120 may comprise an insulating cap sublayer and one or more conductive cap sublayers formed thereon.

The tuning layer 194 of the embodiments of FIGS. 9A/B-14A/B may have a single layer structure or may comprise two, three, four, or more sublayers formed adjacent to each other. One or more of the single layer and the multiple sublayers of the tuning layer 194 may have a thickness less than about 3 nm, preferably less than about 2 nm, more preferably less than about 1 nm, even more preferably less than about 0.8 nm, still even more preferably less than about 0.6 nm. One or more of the single layer and the multiple sublayers of the tuning layer 194 may comprise one or more of the following chemical elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable tuning material such as one of those discussed above for the perpendicular enhancement material. For example, the tuning layer 194 may be made of a single layer of MgO, Ta, Hf, W, Mo, Pt, or Pd. Alternatively, the tuning layer 194 may have a bilayer structure (W/Ta) comprising a W sublayer formed adjacent to the magnetic free layer 154 or structure 122 and a Ta sublayer formed adjacent to the compensation layer 196. Other exemplary bilayer structures, such as Ta/Ru, Ru/Ta, Ta/Hf, Hf/Ta, Ta/W, Ru/W, W/Ru, MgO/Ta, Ta/MgO, MgO/Ru, MgO/Hf, and MgO/W with the first of the two materials being disposed adjacent to the magnetic free layer 154 or 130, may also be used for the tuning layer 194. Still alternatively, the tuning layer 194 may have a bilayer structure comprising an oxide sublayer, such as MgO, formed adjacent to the magnetic free layer 154 or 130 and a thin conductive sublayer, such as CoFeB which may be non-magnetic or superparamagnetic. Additional tuning sublayers may further form adjacent to the exemplary MgO/CoFeB tuning layer to form other tuning layer structures, such as but not limited to MgO/CoFeB/Ru, MgO/CoFeB/Ta, MgO/CoFeB/W, MgO/CoFeB/Hf, MgO/CoFeB/Ru/Ta, MgO/CoFeB/Ta/Ru, MgO/CoFeB/W/Ta, MgO/CoFeB/Ta/W, MgO/CoFeB/W/Ru, MgO/CoFeB/Ru/W, MgO/CoFeB/Hf/Ta, MgO/CoFeB/Ta/Hf, MgO/CoFeB/Hf/W, MgO/CoFeB/W/Hf, MgO/CoFeB/Hf/Ru, MgO/CoFeB/Ru/Hf, MgO/CoFeB/Ru/W/Ta, MgO/CoFeB/W/Ru/Ta, and MgO/CoFeB/Ru/Ta/Ru. As such, the tuning layer 194 may comprise an insulating tuning sublayer formed adjacent to the magnetic free layer 130 or 154 and one or more conductive tuning sublayers formed adjacent to the insulating tuning sublayer.

Figure 1:
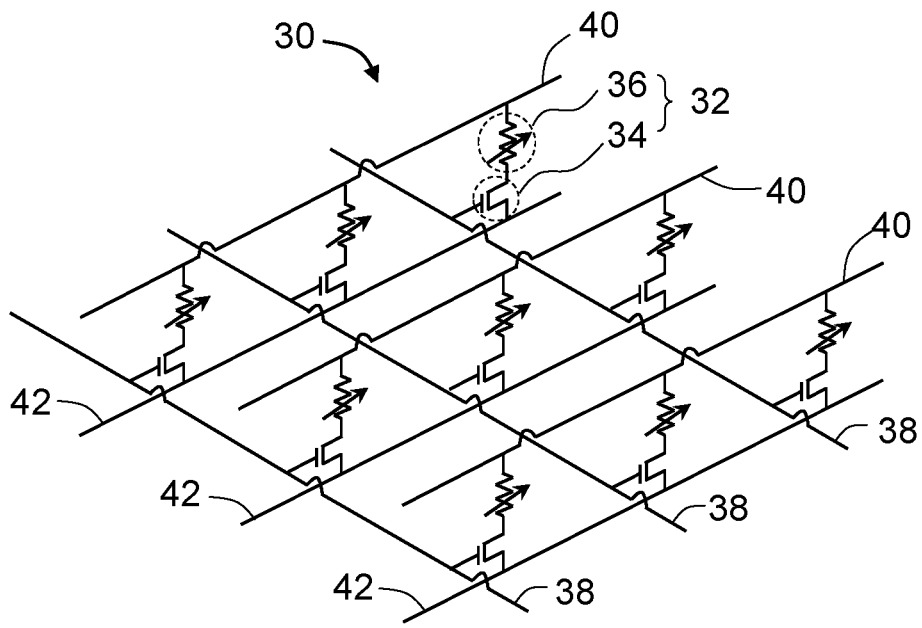
FIG. 1 is a schematic circuit diagram of a conventional STT-MRAM device.
Figure 2:
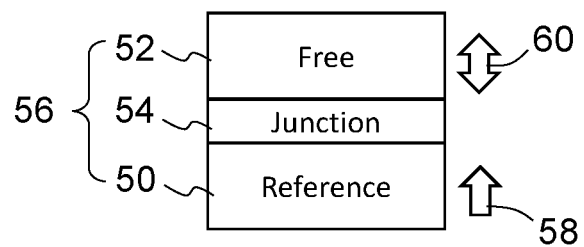
FIG. 2 is a cross-sectional view of a conventional magnetic memory element comprising a perpendicular magnetic tunnel junction (MTJ)

It should be noted that the MTJ memory element of the present invention may be used in any suitable memory device, not just the conventional memory device illustrated in FIG. 1. For example, the MTJ memory element of the present invention may be used in a novel memory device disclosed in U.S. Pat. No. 8,879,306 in which each MTJ memory element is coupled to two transistors.

The previously described embodiments of the present invention have many advantages, including high perpendicular anisotropy, minimum offset field, and improved anti-ferromagnetic coupling. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic memory element comprising:
    a magnetic free layer structure including one or more magnetic free layers that have a same variable magnetization direction substantially perpendicular to layer planes thereof;
    an insulating tunnel junction layer formed adjacent to said magnetic free layer structure;
    a magnetic reference layer structure including a first magnetic reference layer formed adjacent to said insulating tunnel junction layer and a second magnetic reference layer separated from said first magnetic reference layer by a magnesium perpendicular enhancement layer, said first and second magnetic reference layers having a first invariable magnetization direction substantially perpendicular to layer planes thereof;
    an anti-ferromagnetic coupling layer formed adjacent to said second magnetic reference layer opposite said magnesium perpendicular enhancement layer; and
    a magnetic fixed layer structure formed adjacent to said anti-ferromagnetic coupling layer opposite second magnetic reference layer, said magnetic fixed layer structure having a second invariable magnetization direction that is substantially perpendicular to a layer plane thereof and is substantially opposite to said first invariable magnetization direction, wherein said first and second magnetic reference layers have different compositions.

2. The magnetic memory element according to claim 1, wherein said magnetic free layer structure includes a magnetic free layer comprising iron, cobalt, and boron.

3. The magnetic memory element according to claim 1 further comprising a seed layer formed adjacent to said magnetic fixed layer structure opposite said anti-ferromagnetic coupling layer.

4. The magnetic memory element according to claim 3, wherein said seed layer is made of chromium or iridium.

5. The magnetic memory element according to claim 1, wherein said magnetic free layer structure includes a first magnetic free layer and a second magnetic free layer with a non-magnetic perpendicular enhancement layer interposed therebetween, said first and second magnetic free layers having said same variable magnetization direction substantially perpendicular to layer planes of said first and second magnetic free layers.

6. The magnetic memory element according to claim 5, wherein said first and second magnetic free layers comprise iron, cobalt, and boron.

7. The magnetic memory element according to claim 5, wherein said non-magnetic perpendicular enhancement layer is made of magnesium.

8. The magnetic memory element according to claim 5, wherein said non-magnetic perpendicular enhancement layer is made of tantalum, molybdenum, or tungsten.

9. The magnetic memory element according to claim 1, wherein said second magnetic reference layer is made of a material comprising cobalt.

10. The magnetic memory element according to claim 1, wherein said magnetic fixed layer structure includes a multilayer structure formed by interleaving one or more layers of a first material with one or more layers of a second material, at least one of said first and second materials being magnetic.

11. A magnetic memory element comprising:
a magnetic free layer structure including one or more magnetic free layers that have a same variable magnetization direction substantially perpendicular to layer planes thereof;
an insulating tunnel junction layer formed adjacent to said magnetic free layer structure;
a magnetic reference layer structure including a first magnetic reference layer formed adjacent to said insulating tunnel junction layer and a second magnetic reference layer separated from said first magnetic reference layer by a first non-magnetic perpendicular enhancement layer, said first and second magnetic reference layers having a first invariable magnetization direction substantially perpendicular to layer planes thereof;
an anti-ferromagnetic coupling layer formed adjacent to said second magnetic reference layer opposite said first non-magnetic perpendicular enhancement layer;
a magnetic fixed layer structure formed adjacent to said anti-ferromagnetic coupling layer opposite said second magnetic reference layer, said magnetic fixed layer structure having a second invariable magnetization direction that is substantially perpendicular to a layer plane thereof and is substantially opposite to said first invariable magnetization direction;
a seed layer made of chromium or iridium formed adjacent to said magnetic fixed layer structure opposite said anti-ferromagnetic coupling layer, wherein said first and second magnetic reference layers have different compositions.

12. The magnetic memory element according to claim 11, wherein said first non-magnetic perpendicular enhancement layer is made of tantalum, molybdenum, or tungsten.

13. The magnetic memory element according to claim 11, wherein said magnetic fixed layer structure includes a multilayer structure formed by interleaving one or more layers of a first material with one or more layers of a second material, at least one of said first and second materials being magnetic.

14. The magnetic memory element according to claim 13, wherein said first material is cobalt and said second material is platinum or nickel.

15. The magnetic memory element according to claim 11, wherein said magnetic free layer structure includes a first magnetic free layer and a second magnetic free layer with a second non-magnetic perpendicular enhancement layer interposed therebetween, said first and second magnetic free layers having said same variable magnetization direction substantially perpendicular to layer planes of said first and second magnetic free layers.

16. The magnetic memory element according to claim 15, wherein said second non-magnetic perpendicular enhancement layer is made of magnesium.

17. The magnetic memory element according to claim 15, wherein said second non-magnetic perpendicular enhancement layer is made of tantalum, molybdenum, or tungsten.

18. The magnetic memory element according to claim 15, wherein said first and second magnetic free layers comprise cobalt, iron, and boron.

19. A magnetic memory element comprising:
a magnetic free layer structure including a first magnetic free layer and a second magnetic free layer with a magnesium perpendicular enhancement layer interposed therebetween, said first and second magnetic free layers having a same variable magnetization direction substantially perpendicular to layer planes of said first and second magnetic free layers;
an insulating tunnel junction layer formed adjacent to said first magnetic free layer;
a magnetic reference layer structure including a first magnetic reference layer formed adjacent to said insulating tunnel junction layer and a second magnetic reference layer separated from said first magnetic reference layer by a non-magnetic perpendicular enhancement layer, said first and second magnetic reference layers having a first invariable magnetization direction substantially perpendicular to layer planes thereof;
an anti-ferromagnetic coupling layer formed adjacent to said second magnetic reference layer opposite said non-magnetic perpendicular enhancement layer; and
a magnetic fixed layer structure formed adjacent to said anti-ferromagnetic coupling layer opposite said second magnetic reference layer, said magnetic fixed layer structure having a second invariable magnetization direction that is substantially perpendicular to a layer plane thereof and is substantially opposite to said first invariable magnetization direction.

20. The magnetic memory element according to claim 19, wherein said first and second magnetic free layers comprise cobalt, iron, and boron.

21. The magnetic memory element according to claim 19, wherein said non-magnetic perpendicular enhancement layer is made of magnesium.

22. The magnetic memory element according to claim 19, wherein said non-magnetic perpendicular enhancement layer is made of tantalum, molybdenum, or tungsten.

23. The magnetic memory element according to claim 19, wherein said first magnetic reference layer is made of a material comprising cobalt, iron, and boron.

24. The magnetic memory element according to claim 19, wherein said second magnetic reference layer is made of a material comprising cobalt.

25. The magnetic memory element according to claim 19, wherein said magnetic fixed layer structure includes a multilayer structure formed by interleaving one or more layers of a first material with one or more layers of a second material, at least one of said first and second materials being magnetic.

26. The magnetic memory element according to claim 25, wherein said first material is cobalt and said second material is platinum or nickel.

\* \* \* \* \*